US009658486B2

(12) United States Patent
Min

(10) Patent No.: US 9,658,486 B2
(45) Date of Patent: May 23, 2017

(54) LIGHT EMITTING DEVICE AND DISPLAY DEVICE INCLUDING THE SAME

(75) Inventor: Bong Kul Min, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 660 days.

(21) Appl. No.: 13/347,899

(22) Filed: Jan. 11, 2012

(65) Prior Publication Data

US 2012/0275181 A1 Nov. 1, 2012

(30) Foreign Application Priority Data

Apr. 28, 2011 (KR) .................. 10-2011-0040010

(51) Int. Cl.
*F21S 4/00* (2016.01)
*F21V 21/00* (2006.01)
*G02F 1/1335* (2006.01)
*H01L 25/16* (2006.01)
*H01L 33/62* (2010.01)
*H01L 33/60* (2010.01)

(52) U.S. Cl.
CPC ...... *G02F 1/133603* (2013.01); *H01L 25/167* (2013.01); *H01L 33/60* (2013.01); *H01L 33/62* (2013.01); *H01L 2224/48091* (2013.01); *H01L 2224/48465* (2013.01); *H01L 2224/49109* (2013.01); *H01L 2224/49113* (2013.01); *H01L 2924/3025* (2013.01)

(58) Field of Classification Search
CPC . H01L 33/60; H01L 27/3288; H01L 25/0753; H01L 33/62; H01L 2224/48137; H01L 33/483; H01L 33/486; H01L 25/167; H01L 2224/49109; H01L 2224/49113; G02F 1/133603; F21V 23/001; H05K 2201/10106; H05K 2201/10128; H05K 2201/10136

USPC ............. 257/79, 98, 82, 99, 88, E33.058, 257/E33.066, E33.072; 362/97.2, 615, 362/249.02, 241, 346, 310, 97.3, 613, 362/237, 347, 231, 301, 350; 313/505
See application file for complete search history.

(56) References Cited

U.S. PATENT DOCUMENTS

| | | | | |
|---|---|---|---|---|
| 7,115,911 B2 * | 10/2006 | Chang et al. | .................. | 257/81 |
| 7,579,628 B2 * | 8/2009 | Inoguchi | .................. | 257/81 |
| 7,579,629 B2 * | 8/2009 | Inoguchi | .................. | 257/98 |
| 8,044,418 B2 * | 10/2011 | Loh et al. | .................. | 257/98 |
| 8,058,667 B2 * | 11/2011 | Tran et al. | .................. | 257/99 |
| 8,129,741 B2 * | 3/2012 | Lee | .................. | H01L 24/48 |
| | | | | 257/100 |

(Continued)

FOREIGN PATENT DOCUMENTS

WO WO 2009/086909 A2 7/2009
WO WO 2009086909 A2 * 7/2009

*Primary Examiner* — Jong-Suk (James) Lee
*Assistant Examiner* — James Endo
(74) *Attorney, Agent, or Firm* — KED & Associates LLP

(57) ABSTRACT

A light emitting device package is disclosed. The light emitting device package includes a body, first and second reflection cups spaced apart from each other in a top surface of the body, a first connection pad disposed in the top surface of the body, spaced apart from the first and second reflection cups, a first light emitting diode mounted in the first reflection cup, a second light emitting diode mounted in the second reflection cup, and a partition wall disposed between the first reflection cup and the second reflection cup, the partition wall extended from the top surface of the body upwardly.

20 Claims, 12 Drawing Sheets

(56) References Cited

U.S. PATENT DOCUMENTS

| | | | |
|---|---|---|---|
| 8,148,739 B2* | 4/2012 | Lan et al. | 257/88 |
| 8,530,918 B2* | 9/2013 | Jang | 257/98 |
| 2003/0155624 A1* | 8/2003 | Arndt et al. | 257/432 |
| 2004/0056265 A1* | 3/2004 | Arndt et al. | 257/98 |
| 2004/0075100 A1* | 4/2004 | Bogner et al. | 257/99 |
| 2005/0067957 A1* | 3/2005 | Moon | 313/582 |
| 2005/0072981 A1* | 4/2005 | Suenaga | 257/88 |
| 2006/0012992 A1* | 1/2006 | Lee | 362/237 |
| 2006/0016970 A1* | 1/2006 | Nagasaka | G01D 5/305 250/231.13 |
| 2006/0065957 A1* | 3/2006 | Hanya | 257/676 |
| 2006/0245188 A1* | 11/2006 | Takenaka | 362/231 |
| 2007/0075325 A1* | 4/2007 | Baek et al. | 257/99 |
| 2007/0097683 A1* | 5/2007 | Chikugawa | 362/241 |
| 2007/0246729 A1* | 10/2007 | Park | 257/99 |
| 2007/0284605 A1* | 12/2007 | Chen et al. | 257/99 |
| 2008/0210963 A1* | 9/2008 | Lin et al. | 257/98 |
| 2008/0316741 A1* | 12/2008 | Lee | 362/231 |
| 2009/0032826 A1* | 2/2009 | Hu et al. | 257/88 |
| 2010/0001306 A1* | 1/2010 | Park et al. | 257/99 |
| 2010/0047942 A1* | 2/2010 | Lin et al. | 438/27 |
| 2010/0078661 A1* | 4/2010 | Shi et al. | 257/98 |
| 2010/0090231 A1* | 4/2010 | Jung et al. | 257/89 |
| 2010/0128461 A1* | 5/2010 | Kim et al. | 362/84 |
| 2010/0133560 A1* | 6/2010 | Kim et al. | 257/89 |
| 2010/0165237 A1* | 7/2010 | Jung | 349/58 |
| 2011/0012151 A1* | 1/2011 | Ono | 257/98 |
| 2011/0140143 A1* | 6/2011 | Kim et al. | 257/98 |
| 2011/0186873 A1* | 8/2011 | Emerson | 257/88 |
| 2011/0186898 A1* | 8/2011 | Lan et al. | 257/99 |

\* cited by examiner

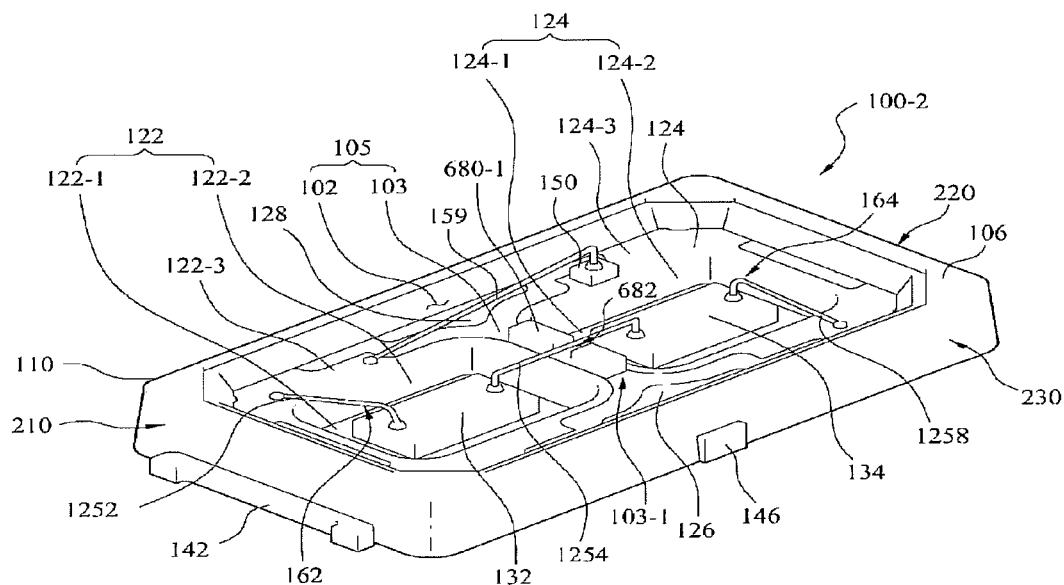

LIGHT EMITTING DEVICE AND DISPLAY DEVICE INCLUDING THE SAME

CROSS REFERENCE TO RELATED APPLICATION

This application claims priority under 35 U.S.C. §119 to Korea Application No. 10-2011-0040010, filed on Apr. 28, 2011, which is hereby incorporated in its entirety by reference as if fully set forth herein.

TECHNICAL FIELD

Embodiments relate to a light emitting device and a display device including the same.

BACKGROUND

A light emitting device, for example, a light emitting diode is a type of semiconductor device that can convert an electric energy into a light has been spotlighted as next generation light source, replacing a conventional fluorescent lamp and an incandescent lamp.

The light emitting diode generating a light by using a semiconductor element may consume relatively small electricity, compared with the incandescent lamp generating a light by heating tungsten or the fluorescent lamp generating by colliding an ultraviolet ray generated by a high voltage discharge with a phosphor.

In addition, the light emitting diode generates the light by using a potential difference of semiconductor elements may have a relatively long usage life and a rapid response, with an eco-friendly characteristic.

As a result, a lot of developments and researches have been in progress to replace the conventional lighting source with the light emitting diode. Usage of such the light emitting diode has been increasing as lighting source for a lighting device, for example, a variety of lamps, a liquid crystal display and an electronic display and streetlamp that are used outdoor.

SUMMARY

A light emitting device package can block light interference and enhance light extraction efficiency, with restraining breakage of wires.

The light emitting device includes a body; first and second reflection cups spaced apart from each other in a top surface of the body; a first connection pad disposed in the top surface of the body, spaced apart from the first and second reflection cups; a first light emitting device disposed on the first reflection cup; a second light emitting device disposed on the second reflection cup; and a partition wall disposed between the first reflection cup and the second reflection cup, the partition wall extended from the top surface of the body upwardly.

The first reflection cup and the second reflection cup may be recessed from the top surface of the body.

The body may include a reflection wall disposed around the first reflection cup, the second reflection cup and the first connection pad, with being extended from the top surface of the body upwardly.

The first reflection cup, the second reflection cup and the first connection pad may be spaced apart from each other in the top surface of the body, and the body may include a first cavity formed by a side wall and the top surface thereof.

The first reflection cup may include a second cavity formed in the top surface of the body, with an open top, and the second reflection cup may include a third cavity formed in the top surface of the body, spaced apart from the second cavity with an open top. The first light emitting device may be disposed on the second cavity and the second light emitting device may be disposed on the third cavity.

The first reflection cup and the second reflection cup may be formed of a material that is different from a material used to form the body, and the partition wall may be formed of a material that is identical to the material used to form the body, and the partition wall is integrally formed with the body.

The first light emitting device may include first and second electrodes having different polarities from each other, respectively, and the second light emitting device may include third and fourth electrodes having different polarities from each other, respectively.

The light emitting device package may further include a first wire connecting the first electrode with the first reflection cup; a second wire connecting the second electrode with the first connection pad; a third wire connecting the first connection pad with the third electrode; and a fourth wire connecting the fourth electrode with the second reflection cup.

The light emitting device package may further include a first wire connecting the first electrode with the first reflection cup; a second wire connecting the second electrode with the second reflection cup; a third wire connecting the first reflection cup with the third electrode; and a fourth wire connecting the fourth electrode with the second reflection cup.

The light emitting device package may further include a first wire connecting the first electrode with the first reflection cup; a second wire connecting the second electrode with the third electrode; and a third wire connecting the fourth electrode with the second reflection cup.

The height of the partition wall may be identical to or smaller than the height of the side wall of the first cavity.

The partition wall may include a first region having a different height, and the second wire passes through the first region.

The partition wall may be disposed on a top surface of the body disposed between the first reflection cup and the first connection pad and between the second reflection cup and the first connection pad.

The partition wall may further include a second region disposed between the first reflection cup and the first connection pad, with a different height; and a third region disposed between the second reflection cup and the first connection pad, with a different height, and the second wire passes the second region and the third wire passes the third region.

The partition wall may have partially different heights and the partition wall comprises first and second regions spaced apart from each other, and the second wire passes the first region and the third wire passes the second region.

The light emitting device package may further include a reflective layer disposed on a side surface of the partition wall.

The reflective layer may be a distributed Bragg reflective layer or a metal layer comprising at least one of Ag, Ni, Al, Rh, Pd, Ir, Ru, mg, Zn, Pt, Au and Hf or an alloy of them.

The light emitting device package may further include a second connection pad disposed in the top surface of the body, spaced apart from the first reflection cup, the second reflection cup and the first connection pad.

The light emitting device package may further include an encapsulation material covering the body, the first reflection cup, the second reflection up, the first connection pad and the partition wall.

In another aspect, a display device include a panel; a backlight unit emitting a light toward the panel; a image signal output circuit connected with the panel, to provide a image signal, wherein the backlight unit may include a bottom cover; a reflective plate disposed on the bottom cover; a light guide plate disposed on the reflective plate; a light emitting module comprising a plurality of light emitting device packages disposed on a substrate, to emit a light toward the light guide plate; and an optical sheet disposed on the light guide plate, and each of the light emitting device packages may include a body; first and second reflection cups spaced apart from each other in a top surface of the body; a first connection pad disposed in the top surface of the body, spaced apart from the first and second reflection cups; a first light emitting device disposed on the first reflection cup; a second light emitting device disposed on the second reflection cup; and a partition wall disposed between the first reflection cup and the second reflection cup, the partition wall extended from the top surface of the body upwardly.

According to the embodiment, light interference may be blocked and light extraction efficiency may be enhanced. Also, wire breakage may be suppressed.

It is to be understood that both the foregoing general description and the following detailed description of the embodiments are exemplary and explanatory and are intended to provide further explanation of the embodiment as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings:

FIG. 14 is a diagram illustrating a light emitting device package according to a further embodiment;

FIG. 15 is a diagram illustrating a light emitting device package according to a still further embodiment;

DESCRIPTION OF SPECIFIC EMBODIMENTS

Figure 1:
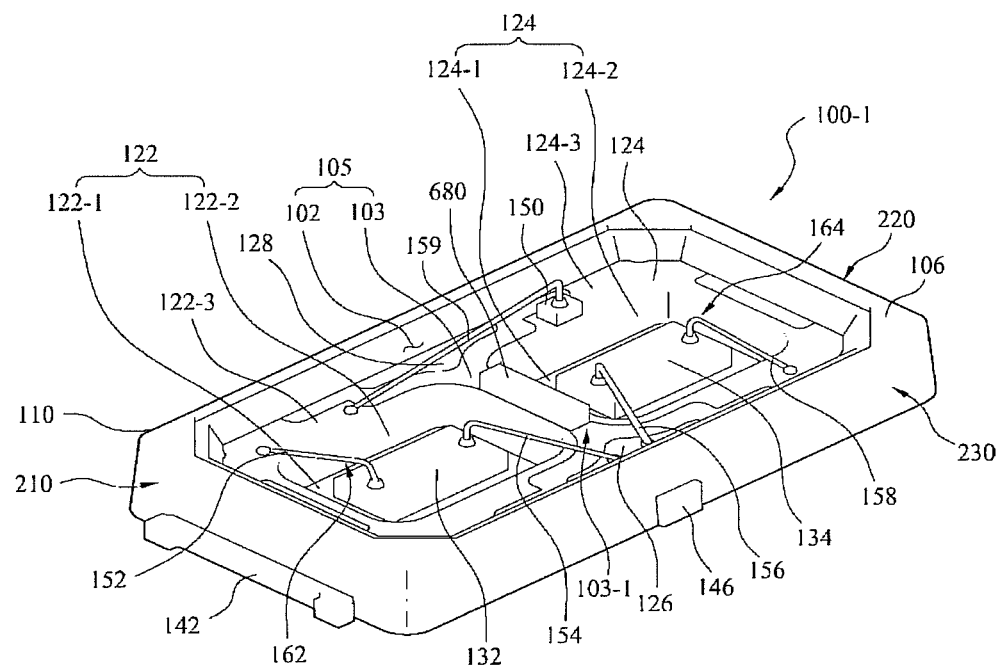
FIG. 1 is a perspective view illustrating a light emitting device package according to an embodiment.

As follows, exemplary embodiments will be described in reference to the accompanying drawings. It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

The thickness and size of each layer may be exaggerated, emitted or illustrated schematically in the drawings, for explanation and precision. The size of each component part shown in the drawings may not reflect the actual size completely. As follows, a light emitting device package 100-1 according to an embodiment will be described in reference to the accompanying drawings.

Figure 2:
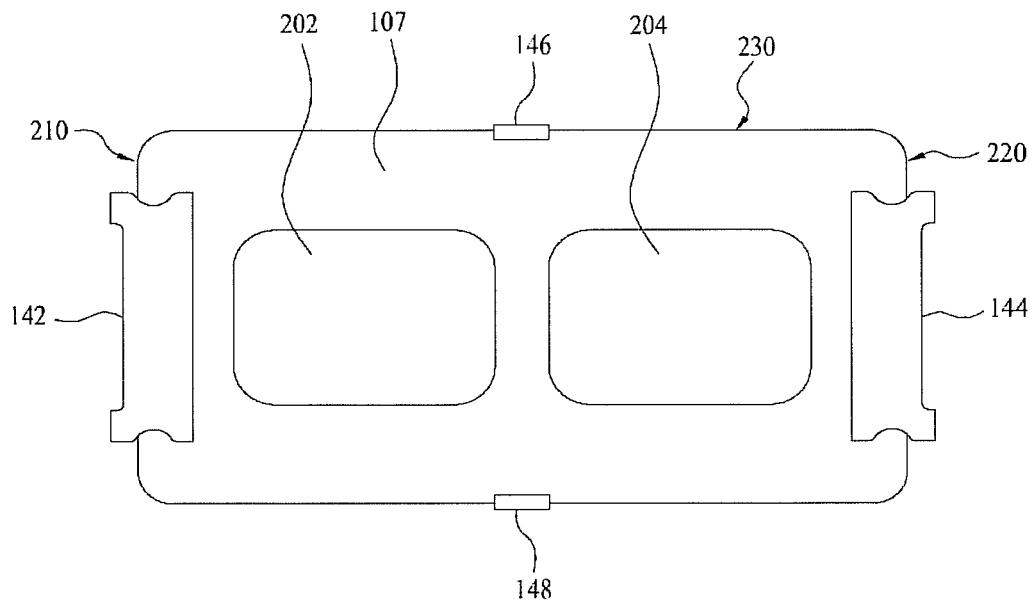
FIG. 2 is a bottom view illustrating the light emitting device package shown in FIG. 1.
Figure 3:
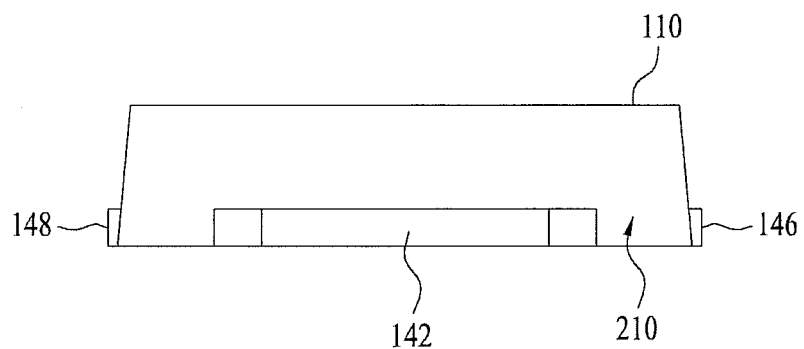
FIG. 3 is a first side view illustrating the light emitting device package shown in FIG. 1.
Figure 4:
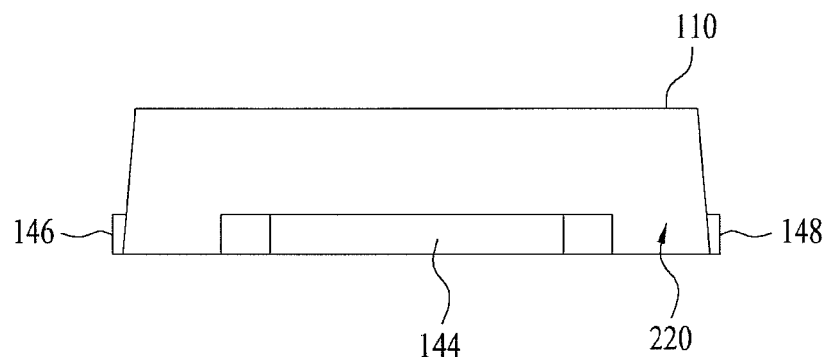
FIG. 4 is a second side view illustrating the light emitting device package shown in FIG. 1.
Figure 5:
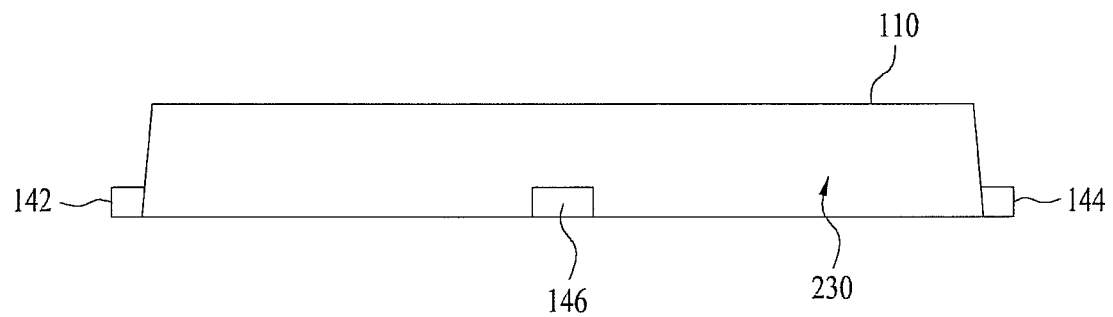
FIG. 5 is a third side view illustrating the light emitting device package shown in FIG. 1.
Figure 6:
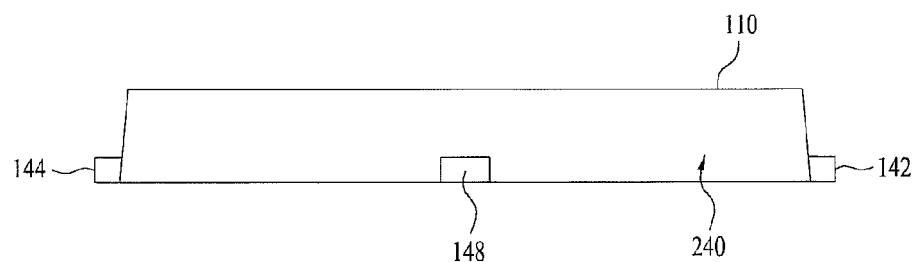
FIG. 6 is a fourth side view illustrating the light emitting device package shown in FIG. 1.
Figure 7:
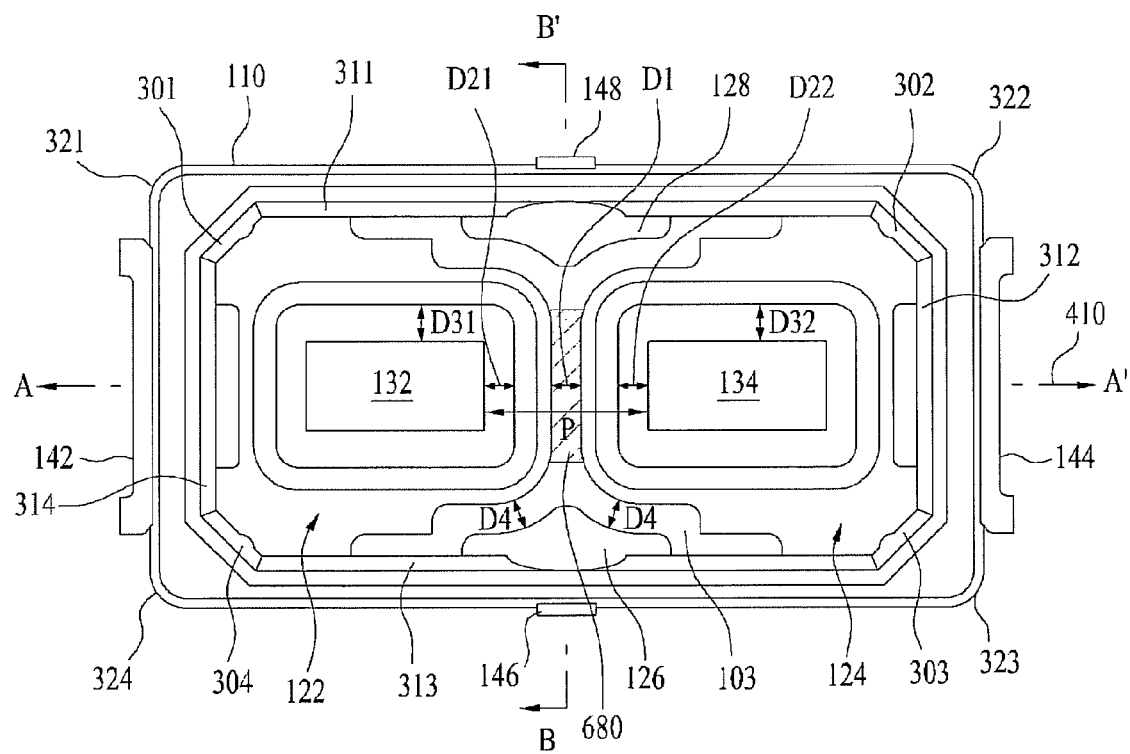
FIG. 7 is a plane view illustrating the light emitting device package shown in FIG. 1.
Figure 8:
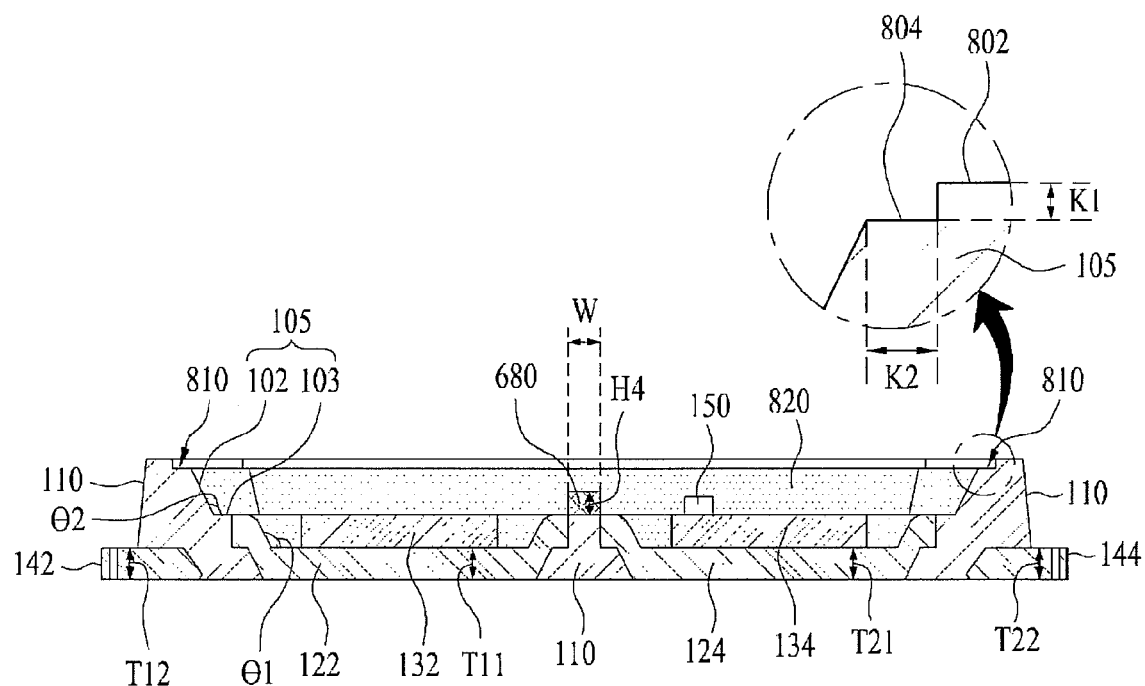
FIG. 8 is a sectional view illustrating the light emitting device package shown in FIG. 1 along AA'.
Figure 9:
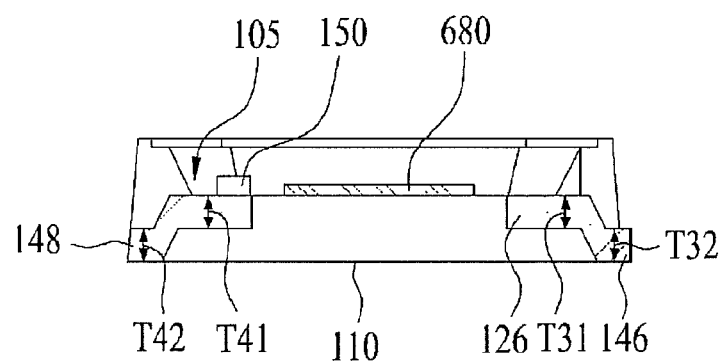
FIG. 9 is a sectional view illustrating the light emitting device package shown in FIG. 1 along BB'.

FIG. 1 is a perspective view illustrating a light emitting device package according to an embodiment. FIG. 2 is a bottom view illustrating the light emitting device package shown in FIG. 1. FIG. 3 is a first side view illustrating the light emitting device package shown in FIG. 1. FIG. 4 is a second side view illustrating the light emitting device package shown in FIG. 1. FIG. 5 is a third side view illustrating the light emitting device package shown in FIG. 1. FIG. 6 is a fourth side view illustrating the light emitting device package shown in FIG. 1. FIG. 7 is a plane view illustrating the light emitting device package shown in FIG. 1. FIG. 8 is a sectional view illustrating the light emitting device package shown in FIG. 1 along AA'. FIG. 9 is a sectional view illustrating the light emitting device package shown in FIG. 1 along BB'.

In reference to FIGS. 1 to 9, the light emitting device package 100 may include a body 110, a first reflection cup 122, a second reflection cup 124, a first connection pad 126, a second connection pad 128, a first light emitting device 132, a second light emitting device 134, a zenor diode 150, wires 151 to 159 and a blocking partition wall 680.

The body may be formed of at least one of resin such as polyphthalamide (PPA), silicon (Si), metal, photo sensitive glass (PSG), sapphire (Al2O3) and a printed circuit board (PCB).

The body 110 may be formed of a conductor having conductivity. If the body 110 is formed of the conductor having the conductivity, an insulative layer (not shown) may be formed on a surface of the body 110, to prevent the body 110 from being electrically short with the first and second reflection cups 122 and 124 and the first and second connection pads 126 and 128.

Seen from above, a shape of a top surface 106 of the body 110 may be various such as triangular, polygonal and circular based on usage and design of the light emitting device package 100.

For example, the light emitting device package 100 shown in FIG. 1 may be applicable to an edge type backlight unit (BLU). If the light emitting device package 100 shown in FIG. 1 is applied to a portable flashlight or home lighting, the size of the body 110 may be changed to enable the body 110 to be mounted in the portable flashlight or the home lighting smoothly.

The body 110 may include a top surface 103 and a reflection wall 102 extended upward from the top surface 103 thereof.

In other words, the body 110 may include a cavity 105 (hereinafter, referenced to as "body cavity") configured of a side surface 102 and a bottom 103, with an open top. Here, the side surface 102 of the cavity 105 may be corresponding to the reflection wall 102 of the body 110 and the bottom 103 of the cavity 105 may be corresponding to the top surface 103 of the body 110.

The body cavity 105 may be cup-shaped or concave container-shaped and the side surface 102 of the cavity 105 may be perpendicular or inclined with respect to the bottom 103.

The shape of the body cavity 105 seen from above may be circular, oval or polygonal (for example, rectangular). A corner of the body cavity 105 may be rounded. The shape of the body cavity 105 shown in FIG. 1 seen from above may be octagonal. The side surface 102 of the body cavity 105 may include eight surfaces and areas of first surfaces 301 to 304 may be smaller than areas of second surfaces 311 to 314. For example, the first surfaces 301 to 304 may be side surfaces of the body cavity 105, in opposite to corners 321 to 324 of the body 110. The second surfaces 311 to 314 may be surfaces positioned between neighboring two of the first surfaces 310 to 304.

Surfaces facing each other may have the same shape and the same area out of the first surfaces 301 to 304 and the second surfaces 411 to 314. Some areas of the facing surfaces may be curved. In another embodiment, a side surface 102 of a body cavity 105 may have eight surfaces or less or eight surfaces or more. Here, some areas of facing surfaces may be curved.

The first reflection cup 122 and the second reflection cup 124 may be spaced apart a predetermined distance from each other on the top surface 103 of the body 110. for example, the first reflection cup 122 and the second reflection cup 124 may be disposed in the bottom 103 of the body cavity 105, spaced apart a proper distance. The first reflection cup 122 may be recessed from the bottom 103 of the body cavity 105, with an open top.

The first reflection cup 122 may include a first bottom 122-1, a first side surface 122-2 and a first top surface 122-3.

The first side surface 122-2 is disposed between the first bottom 122-2 and the first top surface 122-2. The second reflection cup 124 may include a second bottom 124-1, a second side surface 124-2 and a second top surface 124-2. The second side surface 124-2 may be disposed between the second bottom 124-1 and the second top surface 124-2.

The bottom 103 of the body cavity 105 may include a first cavity 162 having an open top, a side surface and a bottom. The first reflection cup 122 may be disposed in the first cavity 162.

The second reflection cup 124 spaced apart a predetermined distance from the first cavity may be recessed from the bottom 103 of the body cavity 105, with an open top. For example, the bottom 103 of the body cavity 105 may have a second cavity 164 having an open top, a side surface and a bottom. The second reflection cup 124 may be disposed in the second cavity 164. At this time, the second cavity 164 may be spaced apart a predetermined distance from the first cavity 162.

Between the first reflection cup 122 and the second reflection cup 124 may be positioned a predetermined area 103-1 of the bottom 103 of the body cavity 105. The first reflection cup 122 and the second reflection cup 124 may be separately distant from each other because of the area 103-1 of the bottom 103.

It can be said that the body cavity 105 and the first reflection cup 122 and the body cavity 105 and the second reflection cup 124 may form a double-cavity structure. Here, the double cavity structure may refer to the structure that the first cavity 162 of the first reflection cup 122 and the second cavity 164 of the second reflection cup 124 are provided in the bottom 103 of the body cavity 105.

The first and second cavities 162 and 164 seen from above may be cup-shaped or concave container-shaped. Each side surface of them may be perpendicular or inclined with respect to each bottom of them.

At least predetermined area possessed by each of the first and second reflection cups 122 and 124 may be exposed outside the body 110, passing through the body 110. Heat emission efficiency may be improved to emit heat generated from the first and second light emitting devices 132 and 134 outside the body 110, because the area of each of the first and second reflection cups 122 and 124 is exposed outside the body 110.

Figure 10:
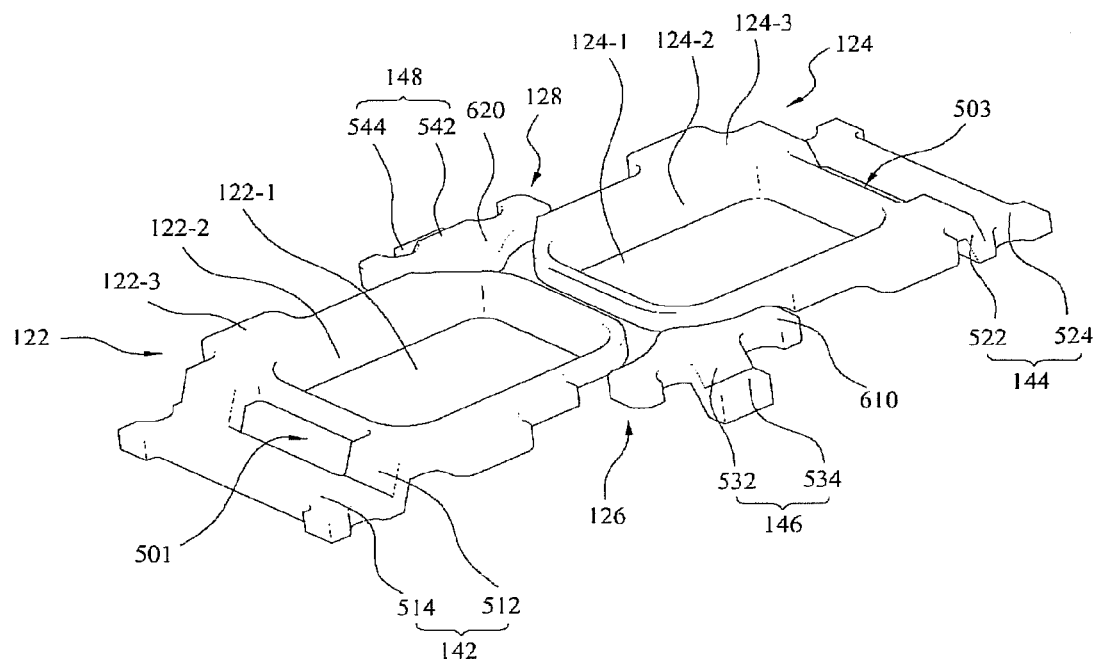
FIG. 10 is a diagram illustrating a first reflection cup, a second reflection cup, a first connection pad and a second connection pad.

FIG. 10 illustrates the first reflection cup 122, the second reflection cup 124, the first connection pad 126 and the second connection pad 128.

In reference to FIG. 10, the first reflection cup 122 may include a first lead frame 142 partially exposed via the first side surface 210 of the body 110. The first lead 142 may include a first bent portion 512 bent from the top surface 122-3 of the first reflection cut 122 toward a back surface 107 of the body 110 and a horizontal portion 514 connected with the bent portion 512 in parallel with the bottom of the first reflection cup 122, with being partially exposed from the first side surface 210 or the back surface 107 of the body 110. The first reflection cup 122 and the first lead frame 142 may be formed of the same material and integrally formed with each other.

The second reflection cup 124 may include a second lead frame 144 partially exposed via the second side surface 220 of the body 110. The second reflection cup 124 and the second lead frame 144 may be formed of the same material and integrally formed with each other.

The second lead frame 144 may include a second bent portion 522 bend from the top surface 124-3 of the second reflection cup 124 toward the back surface 107 of the body 110 and a second horizontal portion 524 connected with the second bent portion 522, in horizontal with the bottom of the second reflection cup 124, with partially exposed to the second side surface 220 and the back surface 107 of the body 110. At least one hole 501 and 503 may be provided in each of the first and second bend portions 512 and 522.

The first reflection cup 122 may have a back surface 202 exposedly projected from the back surface 107 of the body 110, passing through the body 110. An end of the first reflection cup1 122 may be projected from the first side surface 210 via the first side surface 210 of the body, to be exposed outside the body 110.

The second reflection cup 124 may have a back surface 204 exposedly projected from the back surface 107 of the body, passing through the body 110. Also, an end 144 of the second reflection cup 124 may be projected from the second side surface 210 via the second side surface 220 of the body, to be exposed outside the body 110. The exposed ends 142 and 144 of the first and second reflection cup 122 124 may be formed in a variety shapes such as a rectangle, a square or a U-like shape.

The ends 142 and 144 and the bottom surfaces 202 and 204 of the first and second reflection cups 122 and 124 may be exposed to the outside of the body 110. Because of that, the heat generated from the first and second light emitting devices 132 and 34 may be emitted outside the body 110 efficiently according to this embodiment.

The first connection pad 126 may be disposed on the top surface of the body 110, spaced apart a predetermined distance from the first and second reflection cups 122 and 124. The second connection pad 128 may be disposed on the top surface of the body 110, spaced apart a predetermined distance from the first and second reflection cups 122 and 124 and the first connection pad 126.

For example, the first connection pad 126 and the second connection pad 128 may be disposed in the bottom 103 of the body cavity 105, spaced apart a predetermined distance from each other. The bottom 103 of the body cavity 105 may be disposed between the first connection pad 126 and the first reflection cup 122, between the first connection pad 126 and the second reflection cup 124 and between the first connection pad 126 and the second connection pad 128.

The first connection pad 126 may be adjacent to one of the facing side surfaces 102 of the second connection pad 128 and the second connection pad 128 may be adjacent to the other one of the facing side surfaces 102 of the body cavity 105.

For example, the first connection pad 126 may be disposed adjacent to one 311 of the facing first surfaces 311 and 313 or 312 and 314 facing each other, and the second connection pad 128 may be disposed adjacent to the other one 313 of the facing first surfaces 311 and 313 or 312 and 314. For example, the center of the first connection pad 126 may be aligned with a center of the one 311 of the facing first surfaces. The center of the second connection pad 128 may be aligned with a center of the other one 313 of the facing first surfaces.

The first connection pad 126 and the second connection pad 128 may be disposed in the bottom 103 of the body cavity 105 in symmetry. The first connection pad 126 and the second connection pad 128 may be aligned in opposite, to face each other. For example, the center of the first connection pad 126 may be aligned with the center of the second connection pad 128.

Alternatively, the first connection pad 126 and the second connection pad 128 may be disposed in bilateral symmetry with respect to a first baseline 410. The first baseline 410 may be a line connecting each center of the facing first surfaces 312 and 314.

The first connection pad 126 may include a top surface 610 exposedly projected from the bottom of the body cavity 105 and a third lead frame 146 partially exposed via the third side surface 230 of the body 110.

The third lead frame 146 may be connected with the top surface 610 of the first connection pad 126 and it may include a third bent portion 532 and a third horizontal portion 534. The third bent portion 532 may be bent from the top surface 610 of the first connection pad 126 toward the back surface 107 of the first connection pad 126. An angle formed by both of the third bent portion 532 and the top surface 610 of the first connection pad 126 may be an acute angle. The third horizontal portion 534 may be connected with the third bent portion 532, in horizontal with the top surface 610 of the first connection pad 126, and it may be partially projected from the third side surface 230 and the back surface 107 of the body 110 to be exposed outside.

The second connection pad 128 may include a top surface 620 exposedly projected from the bottom of the body cavity 105 and a fourth lead frame 148 partially exposed via the fourth side surface 240 of the body 110.

The fourth lead frame 148 may be connected with the top surface 620 of the second connection pad 128, and it may include a fourth bent portion 542 and a fourth horizontal portion 544. The fourth bent portion 542 may be bent from the top surface 620 of the second connection pad 128 toward the back surface 107 of the body 110. The angle formed by both of the fourth bent portion 542 and the top surface 620 of the second connection pad 128 may be an acute angle. The fourth horizontal portion 544 may be connected with the fourth bent portion 542, in horizontal with the top surface 620 of the first connection pad 128, and it may be partially projected from the fourth side surface 240 and the back surface 107 of the body 110. The first to fourth bent portions 512, 522, 532 and 544 may be disposed in the body 110, without being exposed outside the body 110.

The thickness (T31) of the top surface 610 of the first connection pad 126 may be 200 um~300 um and the thickness (T32) of the third lead frame 146 may be 0.2 mm~0.3 mm. The thickness (T41) of the top surface 620 provided in the second connection pad 128 may be 200 um~300 um and the thickness (T42) of the fourth lead frame 148 may be 0.2 mm~0.3 mm.

Each of the first and second connection pads 126 and 128 may be a sufficient area to bond the wires therein. For example, the minimum diameter passing the center of the first connection pad 126 may no more than 0.15 mm or more and the minimum diameter passing the center of the second connection pad 128 may be 0.15 mm or more.

At least a predetermined area provided in each of the first and second connection pads 126 and 128 may be exposed outside the body 110, passing through the body 110.

For example, the end 146 of the first connection pad 126 may be projected from the back side 107 of the body 110, to be exposed outside the body 110 via the third side surface 230 of the body 110. The third side surface 230 of the body 110 may be perpendicular to the first side surface 210 and the second side surface 220 of the body 110. Also, the end 148 of the second connection pad 126 may be exposedly projected from the back surface 107 of the body 110, to be exposed outside the body 110 via the fourth side surface 240 of the body. The third and fourth side surfaces 230 and 240 of the body 110 may be perpendicular to the first and second side surfaces 210 and 220 of the body 110.

The reflection wall 102 may be positioned around the first and second reflection cups 122 and 124 and the first and second connection pads 126 and 128, expanded from the top surface 103 of the body 110 upwardly.

The first and second reflection cups 122 and 124 and the first and second connection pads 126 and 128 may be formed of a conductive material that can transmit electricity there through. For example, the first and second reflection cups 122 and 124 and the first and second connection pads 126 and 128 may be formed of a metal material, for example, silver, gold, copper and a metal material plated with them.

The first and second reflection cups 122 and 124 and the first and second connection pads 126 and 128 may be formed a different material from the material used to form the body 110, and they may not be integrally formed with the body 110. The first and second reflection cups 122 and 124 may have the same appearance and the size. Also, the first and second connection pads 126 and 128 may have the same appearance and the size.

The zenor diode 150 may be disposed on the first reflection cup 122 or the second reflection cup 124 to improve a withstand voltage of the light emitting device package 100. For example, the zenor diode 150 may be disposed on the first top surface 122-3 of the first reflection cup 122 or the second top surface 124-3 of the second reflection cup 124. In the embodiment shown in FIG. 1, the zenor diode 150 may be mounted on the second top surface 124-3 of the second reflection cup 124 and the embodiment is not limited thereby.

The first light emitting device 132 may be mounted in the first cavity 162 and the second light emitting device 134 may be mounted in the second cavity 164 of the second reflection cup 124. For example, the first light emitting device 132 may be mounted on the bottom 122-1 of the first reflection cup 122 and the second light emitting device 134 may be disposed on the bottom 124-1 of the second reflection cup 124.

The first light emitting device 132 may be spaced apart a predetermined distance from the side surface 122-2 of the first reflection cup 122 and the second light emitting device 134 may be spaced apart a predetermined distance from the side surface 124-2 of the second reflection cup 124.

The first light emitting device 132 and the second light emitting device 134 may be 400 um wide and 1200 um long, and they may be 100 um thick. For example, each chip of the first and second light emitting devices 132 and 134 may be 800 um×400 um, with a thickness of 100 um~150 um.

Figure 21:
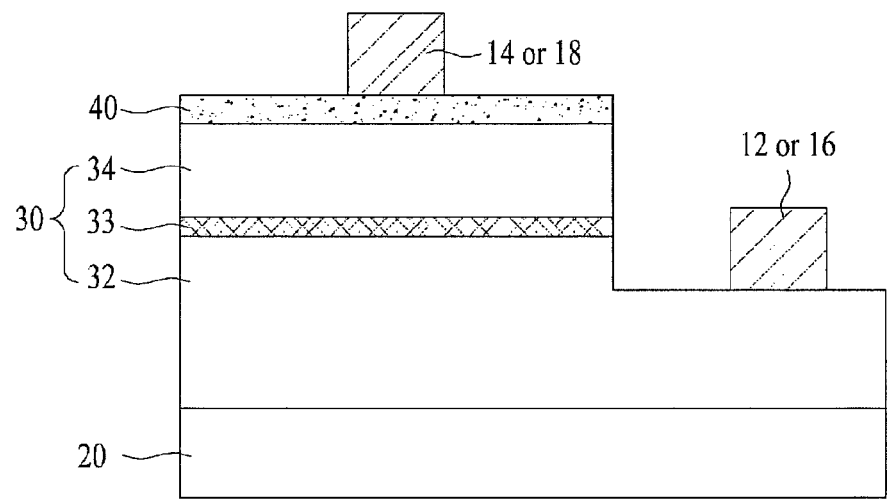
FIG. 21 is a sectional view illustrating a first light emitting device and a second light emitting device according to the embodiment shown in FIG. 1.

FIG. 21 is a sectional view illustrating an embodiment of the first light emitting device 132 and the second embodiment 134 shown in FIG. 1. In reference to FIG. 21, the first light emitting device 132 may include a substrate 20, a light emitting structure 30, a conductive layer 40, a first electrode 12 and a second electrode 14. The second light emitting device 134 may include a substrate 20, a light emitting structure 30, a conductive layer 40, a third electrode 14 and a fourth electrode 18. The second light emitting device 134 shown in FIG. 1 may have the same configuration as the first light emitting device 132. Polarity of the first electrode 12 may be different from polarity of the second electrode 14 and polarity of the third electrode 16 may be in opposite to polarity of the fourth electrode 18.

The substrate 20 supports the light emitting structure 30. The substrate 20 may be one of a sapphire substrate, silicon (Si) substrate, zinc oxide (ZnO) substrate and a nitride substrate or it may be a template substrate having at least one of GaN, AlGaN, AlInGaN, SiC, GaP, InP, $Ga_2O_3$ and GaAs multi-layered thereon.

The light emitting structure 30 may include a first conductivity type semiconductor layer 32, an active layer 33 and a second conductivity type semiconductor layer 34. The first conductivity type semiconductor layer 32 may include an n-type semiconductor layer, for example. The n-type semiconductor layer may be configured of a semiconductor material having an empirical formula: $An_xAl_yGa_{1-x-y}N$ ($0 \le x \le 1$, $0 \le y \le 1$, $0 \le +y \le 1$), for example, a material selected from GaN, AlN, AlGaN, InGaN, InN, InAlGaN and AlInN. An n-type dopant such as Si. Ge, Sn, Se and Te may be doped on the n-type semiconductor layer.

The active layer 33 may be disposed on the first conductivity type semiconductor layer 32 and it may include a semiconductor layer having an empirical formula: $In_xAl_yGa_{1-x-y}N$ ($0 \le x \le 1$, $0 \le y \le 1$, $0 \le x+y \le 1$). The active layer 33 may have at least one of Quantum Wire, Quantum Dot, Single Quantum Well or Multi Quantum Well (MQW) structures.

The active layer 33 may generate a light by using an energy generated in a recombination of an electrode and a hole that are provided by the first conductivity type semiconductor layer 32 and the second conductivity type semiconductor layer 34. The active layer 33 may be a layer capable of generating lights with a variety of wavelengths and the range of wavelengths possessed by the generated lights may not be limited.

The second conductivity type semiconductor layer 34 may be disposed on the active layer 33. The second conductivity type semiconductor layer 34 may be a p-type semiconductor layer, for example. The p-type semiconductor layer may be a semiconductor material having an empirical formula: $In_xAl_yGa_{1-x-y}N$ ($0 \le x \le 1$, $0 \le y \le 1$, $0 \le x+y \le 1$), for example, a material selected from GaN, AlN, AlGaN, InN, InAlGaN and AlInN, with a p-type dopant such as Mg, Zn, Ca, Sr and Ba may doped thereon.

The second conductivity type semiconductor layer 34, the active layer 33 and the first conductivity type semiconductor layer 32 may be partially mesa-etched, to partially expose the first conductivity type semiconductor layer 32 such that the light emitting structure 30 may be formed.

The conductive layer 40 may be disposed on the second conductivity type semiconductor layer 34. The conductive layer 40 may reduce full-reflection, with an excellent transmissivity. Because of that, the conductive layer 40 may improve extraction efficiency of the lights emitted from the second conductivity type semiconductor layer 34. The conductive layer 40 may be formed of a transparent oxide-based material with a high transmissivity with respect to the wavelengths of the lights. For example, the transparent oxide-based may be indium in oxide (INO), tin oxide (TO), indium zinc oxide (IZO) and zinc oxide (ZO). According to another embodiment, the conductive layer 40 may be omitted.

The first electrode 12 and the third electrode 16 may be disposed on the exposed region of the first conductivity type semiconductor layer 32 and the second electrode 14 or the fourth electrode 18 may be disposed on the second conductivity type semiconductor layer 34 or the conductive layer 40. The first electrode 12 and the third electrode 16 may be n-type electrodes, and the second electrode 14 and the fourth electrode 18 may be p-type electrodes. The first to fourth electrodes 12, 14, 16 and 18 may be formed of a metal material, for example, a material including one or more of Ti, Al, Al alloy, In, Ta, Pd, co, Ni, Si, Ge, Ag, Ag alloy, Au, Hf, Pt, Ru and Au or alloy of them. Also, the first to fourth electrodes 12, 14, 16 and 18 may be single-layered or multi-layered.

The blocking partition wall 680 may be positioned on the top surface 103 of the body 110, between the first and second reflection cups 122 and 124. The blocking partition wall 680 may be extended from the top surface 103 of the body 110 upwardly. That is, the blocking partition 680 may be partially disposed on the bottom 103 of the cavity 105, positioned between the first and second reflection cups 122 and 124.

The reflection wall 102 may be position around the first reflection cup 122, the second reflection cup 124, the first connection pad 126 and the second connection pad 128. Also, the reflection wall 102 may be extended from the top surface 103 of the body 110 upwardly.

The blocking partition wall 680 may block the light emitted from the first light emitting device 132 and the light emitted from the second light emitting device 134 from interfering with each other.

The height (H4) of the blocking partition wall 680 may be identical to or larger than the height of the wires 152 to 158 bonded in the first and second light emitting devices 132 and 134. The height (H4) may be identical to or smaller than the height of the side wall 102 of the cavity 105 and the embodiment may not be limited thereby. The height of at least one of the wires 152 to 158 may be larger than the height (H4) of the blocking partition wall 680.

The blocking partition wall 680 may be formed of the same material as the material used to form the body 110 and it may be integrally formed with the body 110. However, the embodiment may not be limited thereby. The width (W) of the blocking partition wall 680 may be identical to or smaller than the distance (D1) between the first reflection cup 122 and the second reflection cup 124.

According to the embodiment shown in FIG. 1, the blocking partition wall 680 may not be positioned on the other region except the region of the bottom 103 of the cavity 105 located between the first reflection cup 122 and the first connection pad 126, between the first reflection cup 122 and the second connection pad 128, between the second reflection cup 124 and the first connection pad 126 and between the second reflection cup 124 and the second connection pad 128.

The blocking partition wall 680 may have a variety of appearances projected from the bottom 103 of the cavity 105. The blocking partition wall 680 shown in FIG. 1 may be cubic and the embodiment is not limited thereby. It may be realized variably such as polyhedral, hemispherical, and dome-shaped.

The wires 152 to 158 may enable the first light emitting device 132, the second light emitting device 134 and the first connection pad 126 to be electrically connected. The first wire 152 may connect the first light emitting device 122 with the first reflection cup 132 and the second wire 154 may connect the first light emitting device 122 with the first connection pad 126. The third wire 156 may connect the first connection pad 126 with the second light emitting device 124 and the fourth wire 158 may connect the second light emitting device 124 with the second reflection cup 134.

The fifth wire 159 may electrically connect the zenor diode 150 mounted on the top surface 124-1 of the second reflection cup 124 with the first reflection cup 122. For example, an end of the fifth wire 159 may be bonded with the zenor diode 150 and the other end of the fifth wire 159 may be bonded with the top surface 124-3 of the second reflection cup 124.

The first light emitting device 132 and the second light emitting device 134 may generate lights and they are also heat sources that emit heat. The first reflection cup 122 may block the heat generated from the first light emitting device of the heat source from emitting toward the body 110. The second reflection cup 124 may block the heat generated from the second light emitting device 134 from emitting toward the body 110. In other words, the first reflection cup 122 and the second reflection cup 124 may thermally separate the first light emitting device 132 and the second light emitting device 134 that are the heat sources from the other component parts. The first and second reflection cups 122 and 124 may block the lights emitted from the first and second light emitting devices 132 and 134 from interfering with each other.

Especially, in the embodiment, the first and second reflection cups 122 and 124 may be formed in the bottom 103 of the body 110 and a region of the bottom of the body 110 may be disposed between the first reflection cup 122 and the second reflection cup 124. Because of that, the thermal separation enabled by the first and second reflection cups 122 and 124 may be improved and the interference of the lights generated from the first and second light emitting devices 132 and 134 may be reduced more. As a result, the embodiment may separate the first light emitting device 132 and the second light emitting device 134 from each other thermally and optically by the first and second light emitting devices 132 and 134.

The first reflection cup 122 and the second reflection cup 124 may be spaced a predetermined distance (D1) from each other and between them may be disposed a predetermined region 103-1 of the bottom 103 of the body 110 formed of polyphthalamide.

Also, to block the light interference between the light emitting devices 132 and 134 effectively and to improve the reflection efficiency, the first light emitting device 132 may be mounted on the bottom (122-1) of the first reflection cup 122, spaced apart a predetermined distance from the side surface 122-2 of the first reflection cup 122, and the second light emitting device 134 may be mounted on the bottom 124-1 of the second reflection cup 124, spaced apart a predetermined distance from the side surface 124-2 of the second reflection cup 124.

The first connection pad 126 may be spaced apart a predetermined distance (D4) from each of the first and second reflection cups 122 and 124, and the bottom 103 of the body 110 formed of polyphthalamide may be disposed between the first reflection cup 122 and the second reflection cup 124.

The second connection pad 128 may be spaced apart a predetermined distance from each of the first and second reflection cups 122 and 124, and the bottom 103 of the body 110 formed of polyphthalamide may be disposed between the first reflection cup 122 and the second reflection cup 124.

A slope angle (θ1) of the side surface of the first reflection cup 122 may be identical to or different from a slope angle of the body cavity 105. For example, the angle (θ1) between the side surface and the bottom of the first reflection cup 122 may be 90°~160°.

An angle (θ2) between the side surface 102 and the bottom 103 of the body cavity 105 may be 140°~170% An upper end of the side surface 102 of the body cavity 105 may be bent. In other words, the body cavity 105 may include a rim portion 804 positioned between a top surface 802 and the bottom 103 of the body 110, with stepped from the top surface 802 of the body 110 in horizontal with the top surface 802.

The thickness (T11) of the first reflection cup 122 may be 200 um~300 um. For example, the thickness of each of the bottom 122-1, the side surface 122-2 and the top surface 122-3 composing the first reflection cup 122 may be 200 um~300 um. The thickness (T21) of the second reflection cup 124 may be 200 um~300 um. For example, the thickness of the bottom 124-1, the side surface 124-2 and the top surface 124-3 composing the second reflection cup 124 may be 200 um~300 um.

The thickness 142 of the exposed end of the first reflection cup 122 toward the first side surface 210 of the body 110 may be 0.2 mm~0.3 mm. The thickness 144 of the exposed end of the second reflection cup 124 toward the second side surface 220 of the body 110 may be 0.2 mm~0.3 mm.

The top surface 122-3 of the first reflection cup 122 and the top surface 124-3 of the second reflection cup 124 may be in parallel with the bottom 103 of the body cavity 105. The top surfaces of the first and second connection pads 126 and 128 may be in parallel to the top surfaces of the first and second reflection cups 122 and 124. However, the embodiment may not be limited thereby. The bottom 103 of the body cavity 105 may be higher than the top surface 122-3 of the first reflection cup 122, the top surface 124-3 of the second reflection cup 124 and the top surfaces of the first and second connection pads 126 and 128.

The thickness (T31) of the first connection pad 126 may be 200 um~300 um. The thickness (T32) of the exposed end 146 of the first connection pad 126 toward the outside may be 0.2 mm~0.3 mm. The thickness (T41) of the second connection pad 128 may be 200 um~300 um. The thickness (T42) of the end 148 of the second connection pad 128 toward the outside of the body 110 may be 0.2 mm~0.3 mm.

In the light emitting device package according to the embodiment shown in FIG. 8, the body cavity 105 may be filled with an encapsulation material 820, to encapsulate and protect the first and second light emitting devices 132 and 134.

The encapsulation material 820 may fill not only in the body cavity 105 but also in the first reflection cup 122 having the first light emitting device 132 mounted therein and the second reflection cup 124 having the second light emitting device 134 mounted therein to isolate the first and second light emitting devices 132 and 134 from the outside. In other words, the encapsulation material 820 may cover the body, the first reflection cup, the second reflection cup, the first connection pad and the blocking partition wall.

The encapsulation material 820 may be formed of silicon or resin. After silicon or resin fills in the body cavity 105, the silicon or resin may be hardened to form the encapsulation material 820 and the embodiment is not limited thereby.

The encapsulation material 820 may include a phosphor to change characteristics of the lights emitted from the first and second light emitting devices 132 and 134. The phosphor may enable excitation of the lights emitted from the light emitting devices 132 and 134, to realize different color lights.

For example, if the light emitting devices 132 and 134 may be blue light emitting diodes and the phosphor is a yellow light luminescence material, the yellow light of the yellow phosphor may be in excitation because of the blue light and a white light may be generated after that. When the light emitting devices 132 and 134 emit ultraviolet rays, R, G and B phosphors may be added to the encapsulation material 820 to realize a white light. Here, a lens (not shown) may be formed on the encapsulation material 820 to adjust distribution of the lights emitted from the light emitting device package 100.

To block the light interference between the light emitting devices 132 and 134 and to improve light reflection efficiency, the height (H1) of the first reflection cup 122 and the height of the second reflection cup 124 may be determined in consideration of the heights of the light emitting devices 132 and 134. Here, the height of the first reflection cup 122 may be identical to that of the second reflection cup 124.

Figure 11:
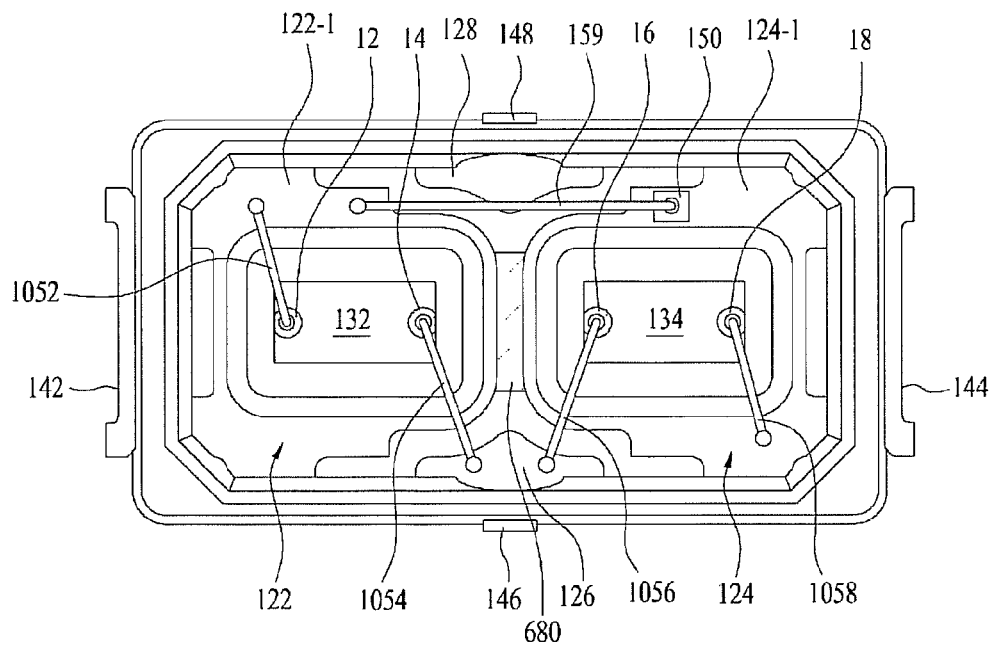
FIG. 11 is a diagram illustrating serial connection according to an embodiment between the light emitting devices provided in the light emitting device package.

FIG. 11 illustrates serial connection according to an embodiment between the light emitting devices provided in the light emitting device package. In reference to FIG. 11, an end of a first wire 1052 may be bonded with the top surface 122-3 of the first reflection cup 122 and the other end of the first wire 1052 may be bonded with the first light emitting device 132. An end of a second wire 1054 may be bonded with the first light emitting device and the other end of the second wire 1054 may be bonded with the first connection pad 126.

An end of a third wire 1056 may be bonded with the first connection pad 126 and the other end of the third wire 1056 may be bonded with the second light emitting device 134. Also, an end of a fourth wire 1058 may be bonded with the second light emitting device 134 and the other end of the fourth wire 1058 may be bonded with the top surface 124-3 of the second reflection cup 134.

For example, one of the first and second electrodes 12 and 14 may be electrically connected with the first reflection cup 122 and one of the third and fourth electrodes 16 and 18 may be electrically connected with the second reflection cup 124. The first connection pad 126 may electrically connect the other one of the first and second electrodes 12 and 14 with the other one of the third and fourth electrodes 16 and 18.

The serial connection between the light emitting devices 132 and 134 shown in FIG. 11 may be enabled by means of the connection pads 126 independent from the light emitting devices 132 and 134. Because of that, the first light emitting device 132 and the second light emitting device 134 may be securely connected with each other in serial and electrical reliability of the light emitting device package may be enhanced accordingly.

Figure 12:
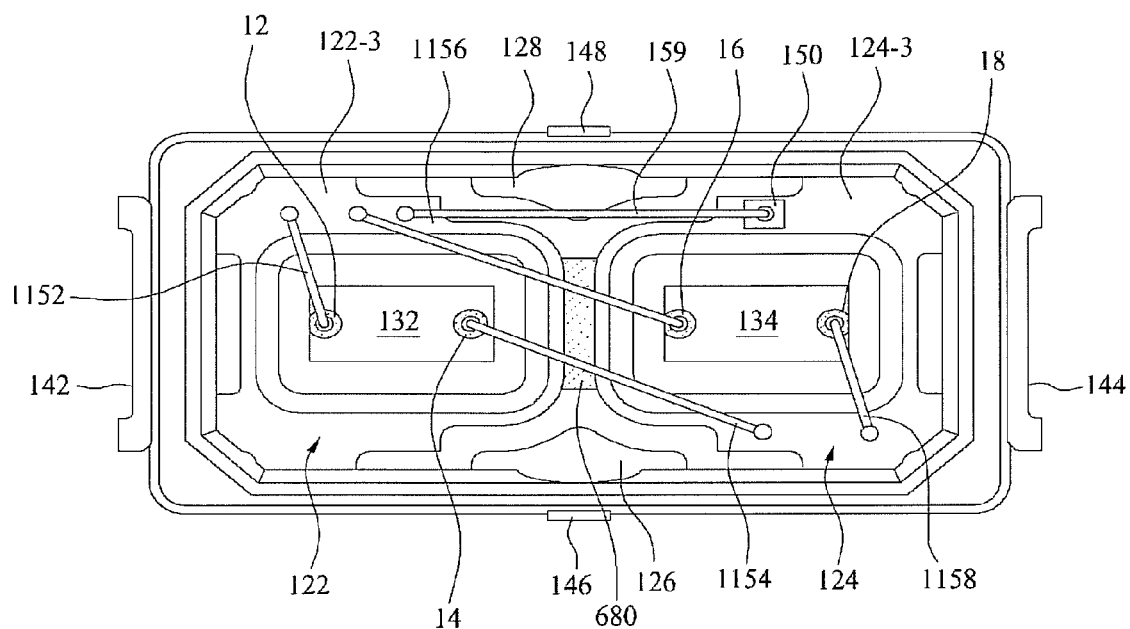
FIG. 12 is a diagram illustrating parallel connection according to the embodiment between the light emitting device provided in the light emitting device.

FIG. 12 illustrates parallel connection according to an embodiment between the light emitting devices provided in the light emitting device package. In reference to FIG. 12, an end of a first wire 1152 may be bonded with the top surface 122-3 of the first reflection cup 132 and the other end of the first wire 1152 may be bonded with the first light emitting device 132.

An end of a second wire 1154 may be bonded with the first light emitting device 132 and the other end of the second wire 1154 may be bonded with the top surface 124-3 of the second reflection cup 134. An end of a third wire 1156 may be bonded with the top surface 122-1 of the first reflection cup 132 and the other end of the third wire 1156 may be bonded with the second light emitting device 134. At this time, each predetermined area of the second and third wires 1154 and 1156 may be positioned on the blocking partition wall 680.

Lastly, an end of a fourth wire 1158 may be bonded with the second light emitting device 134 and the other end of the fourth wire 1158 may be bonded with the top surface 124-1 of the second reflection cup 134. As a result, the light emitting devices 132 and 134 may be electrically connected with each other in parallel by the bonding with the first to fourth wires 1154 to 1158.

For example, one of the first and second electrodes 12 and 14 may be electrically connected with the first reflection cup 122. One of the third and fourth electrodes 16 and 18 may be electrically connected with the second reflection cup 124. The other one of the first and second electrode 12 and 14 may be electrically connected with the second reflection cup 124. The other end of the third and fourth electrodes 18 may be electrically connected with the first reflection cup 122.

Figure 13:
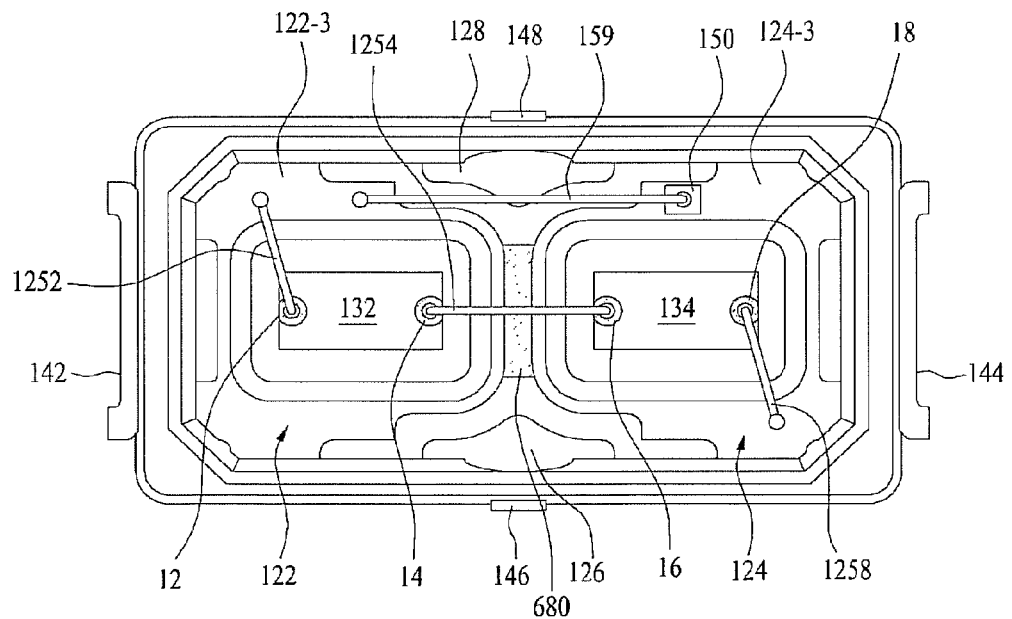
FIG. 13 is a diagram illustrating serial connection according to another embodiment between the light emitting devices provided in a light emitting device package.

FIG. 13 illustrates serial connection according to another embodiment between the light emitting devices of the light emitting device package. In reference to FIG. 13, an end of a first wire 1252 may be bonded with the top surface 122-1 of the first reflection cup 132 and the other end of the first wire 1252 may be bonded with the first light emitting device 132. An end of a second 1154 may be bonded with the first light emitting device 132 and the other end of the second wire 1154 may be directly bonded with the second light emitting device 134. At this time, a predetermined area of the second wire 1154 may be positioned on the blocking partition wall 680.

An end of a third wire 1156 may be connected with the second light emitting device and the other end of the third wire may be bonded with the top surface 124-1 of the second reflection cup 134.

For example, one of the first and second electrodes 12 and 14 may be electrically connected with the first reflection cup 122. One of the third and fourth electrodes 16 and 18 may be electrically connected with the second reflection cup 124. The other one of the first and second electrode 12 and 14 may be electrically connected with the other one of the third and fourth electrodes 16 and 18.

The light emitting devices 132 and 134 shown in FIG. 13 may be electrically connected with each other in serial by the bonding with the first to third wires 1252 to 1256. Different from FIG. 11, the first and second light emitting devices 132 and 134 may be directly connected with each other by the second wire 1254, not by means of the connection pad 126.

Each height of the wires bonded with the first reflection cup 122, the second reflection cup 124, the first light emitting device 132, the second light emitting device 134 and the zenor diode 150, respectively, may be smaller than the height of the top surface 106 of the body cavity 105.

According to the embodiment, the light emitting devices 132 and 134 may be mounted in the two reflection cups 122 and 124 separately provided in the body, respectively, not the single cup type light emitting device package. Because of that, the light emitting devices 132 and 134 that are the heat sources may be separated from each other and the reflection cups 122 and 124 may block the heat emitted from the light emitting devices 132 and 134, to prevent discoloration of the body 110 provided in the light emitting device package 100 and to extend the life span of the light emitting device package 100 accordingly. Also, the two reflection cups 122 and 124 separated from each other may prevent the lights emitted thereby from interfering with each other.

FIG. 14 illustrating a light emitting device package 100-2 according to a further embodiment. The same numeral references given to component parts of FIG. 14 as FIG. 1 will refer to the same component parts. Repeated description with respect to the description mentioned above will be omitted or made in brief. Connection between wires 1252, 1254 and 1258 shown in FIG. 14 may be the serial connection shown in FIG. 13.

In reference to FIG. 14, the light emitting device package 100-2 may include a body 110, a first reflection cup 122, a second reflection cup 124, a first connection pad 126, a second reflection cup 128, a first light emitting device 132, a second light emitting device 134, a zenor diode 150, the wires 1252, 1254 and 1258 and a blocking partition wall 680-1.

The blocking partition wall 680-1 may be similar to the blocking partition wall 680 shown in FIG. 1.

The blocking partition wall 680-1 may include a first region 682 having a different height from the height of the other region. The height of the first region 682 may be lower than the height of the other region of the blocking partition wall 680-1. That is, the first region 682 may be recess-shaped. For example, the blocking partition wall 680-1 may have a first recess 682. The first recess 682 may be recessed from a top surface of the blocking partition wall 680-1, with being open from a side to the other opposite side of the blocking partition wall 680-1. For example, the first recess 682 may be a top that is open toward both of the first and second reflection cups 122 and 124. The first recess 682 may be aligned with a second electrode 14 of the first light emitting device 132 mounted in the first reflection cup 122 and a first electrode 16 of the second light emitting device 134 mounted in the second reflection cup 124. The first recess 682 may expose a bottom 103 of a cavity 105 or not.

The first wire 1252 may electrically connect the first reflection cup 122 with the first electrode 12 of the first light emitting device 122. The fourth wire 1258 may electrically connect the second reflection cup 124 with the second electrode 18 of the second light emitting device 124.

The second wire 1254 may electrically connect the second electrode 14 of the first light emitting device 122 with a third electrode of the second light emitting device 124. The second wire 1254 may connect the second electrode 14 with the third electrode 13 via the first recess 682. In other words, the second wire 1254 may be disposed in the first recess 682 partially. The second wire 1254 may be in contact with a lower surface 603 of the first recess 682, spaced apart a predetermined distance from a side wall 601 of the first recess 682. Arrangement of the second wire 1254 passing the first recess 682 according to an embodiment will be shown in FIG. 19.

When the first light emitting device 122 and the second light emitting device 124 are connected with each other in serial by the wire, the wire has to be disposed beyond the blocking partition wall 680 and the wire has to be provided higher accordingly. The high wire happens to break disadvantageously.

However, the blocking partition wall 680-1 shown in FIG. 14 may include the first recess 682. Because of that, the height of the second wire 1254 may be smaller than the height of the blocking partition wall 680-1. This embodiment may prevent the second wire 1254 directly connecting the first and second light emitting devices 132 and 134 from breaking easily.

FIG. 15 illustrates a light emitting device package 100-3 according to a further embodiment.

In reference to FIG. 15, a blocking partition wall 680-2 may be similar to the blocking partition wall 680-1 shown in FIG. 14.

The blocking partition wall 680-2 may include first and second regions 682-1 and 682-2 having a different height. Here, the first region 682-1 may be spaced apart a predetermined distance from the second region 682-2.

Each height of the first and second regions 682-1 and 682-2 may be smaller than the height of the other region of the blocking partition wall 680-1. For example, the blocking partition wall 680-2 may include a first recess 682-1 and a second recess 682-2 that are spaced apart a predetermined distance from each other.

Each of the first and second recesses 682-1 and 682-2 may be recessed from a top surface of the blocking partition wall 680-2, with being open from a side to the other opposite side of the blocking partition wall 680-2. For example, top surfaces of the first and second recesses 682-1 and 682-2 may be open toward the first reflection cup 122 and the second reflection cup 124, respectively. Each of the first and second recesses 682-1 and 682-2 may be inclined recesses having a proper slope with respect to the side surface of the blocking partition wall 680-2. The first and second recesses 682-1 and 682-2 may expose the bottom 103 of the cavity or not.

A first wire 1152 may electrically connect the first reflection cup 122 with a first electrode 12 of the first light emitting device 122 and a fourth wire 1158 may electrically connect the second reflection cup 124 with a second electrode 18 of the second light emitting device 124.

A second wire 1154 may electrically connect the second electrode 14 of the first light emitting device 122 with the second reflection cup 124 via the second recess 682-2 and a third wire 1156 may electrically connect a third electrode 16 of the second light emitting device 124 with the first reflection cup 122 via the first recess 682-1.

That is, the second wire 1154 may be partially disposed in the second recesses 682-1 and the third wire 1156 may be partially disposed in the first recess 682-1. The second wire 1154 may be in contact with a lower surface of the second recess 682-2, spaced apart a predetermined distance from a side wall of the second recess 682-2. Also, the third wire 1156 may be in contact with a lower surface of the first recess 682-1, spaced apart a predetermined distance from a side wall of the first recess 682-1.

Figure 16:
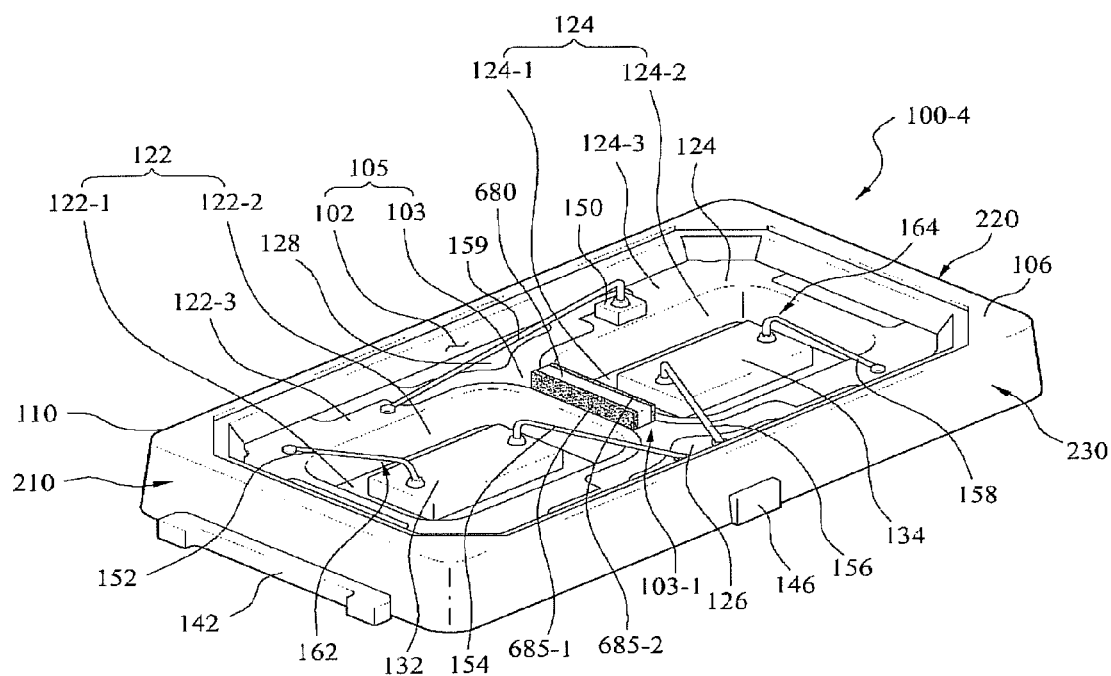
FIG. 16 is a diagram illustrating a light emitting device package according to a still further embodiment.

FIG. 16 illustrates a light emitting device package 100-4 according to a still further embodiment. The same numeral references given to component parts of FIG. 16 as FIG. 1 will refer to the same component parts. Repeated description with respect to the description mentioned above will be omitted or made in brief.

In reference to FIG. 16, a blocking partition wall 680 according to this embodiment may be formed of a reflective material capable of reflecting a light. When the blocking partition wall 680 and a body 110 are formed of the same material, reflective layers 685-1 and 685-2 may be disposed on side surfaces of the blocking partition wall 680. For example, a first reflective layer 685-1 may be disposed on a side of the blocking partition wall 680-1 that faces the first reflection cup 122 and a second reflective layer 685-2 may be disposed on a side of the blocking partition wall 680-1 that faces the second reflection cup 124.

The reflective layer 685-1 and 685-2 may be formed of metal including at least one of Ag, Ni, Al, Rh, Pd, Ir, Ru, Mg, Zn, Pt, Au and Hf or alloy of them.

Also, the reflective layer 685-1 and 685-2 may be distributed Bragg reflective layers. For example, the reflective layer 685-1 and 685-2 may have the first and second layers alternatively multilayered at least one time. At this time, the first layer may include a semiconductor layer such as AlGaAs or a dielectric material such as $TiO_2$. The second layer may include a semiconductor layer such as AlAs or a dielectric material such as $SiO_2$. For example, the reflective layer 685-1 and 685-2 may be a distributed Bragg reflective layer having an AlGaAs/AlAs layer or a $TiO_2$/$SiO_2$ layer multilayered at least one time. The reflective layer 685-1 and 685-2 may block interference of lights emitted from the first and second light emitting devices 132 and 134 with each other and enhance efficiency of light extraction performed by the light emitting device package simultaneously.

Figure 17:
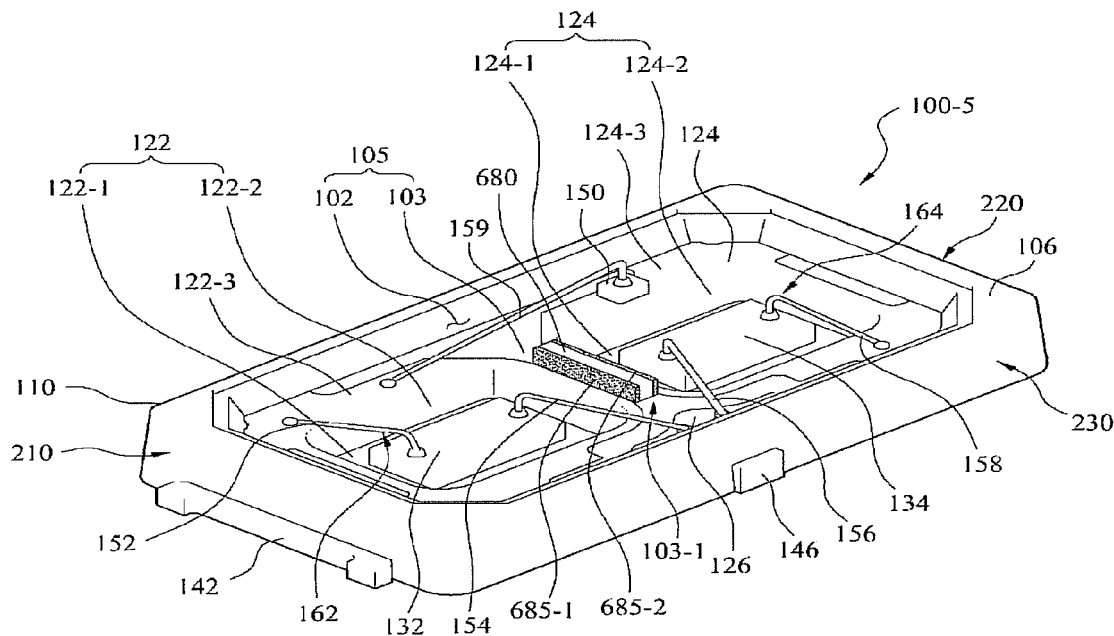
FIG. 17 is a diagram illustrating a light emitting device package according to a still further embodiment.

FIG. 17 illustrates a light emitting device package 100-5 according to a still further embodiment. The same numeral references given to component parts of FIG. 17 as FIG. 16 will refer to the same component parts. Repeated description with respect to the description mentioned above will be omitted or made in brief.

The light emitting device package 100-5 shown in FIG. 17 may not include the second connection pad 128 provided in the light emitting device 100-3 shown in FIG. 15 and the other component parts of the light emitting device 100-4 may be the same as those of the light emitting device 100-3 shown in FIG. 15.

Figure 18:
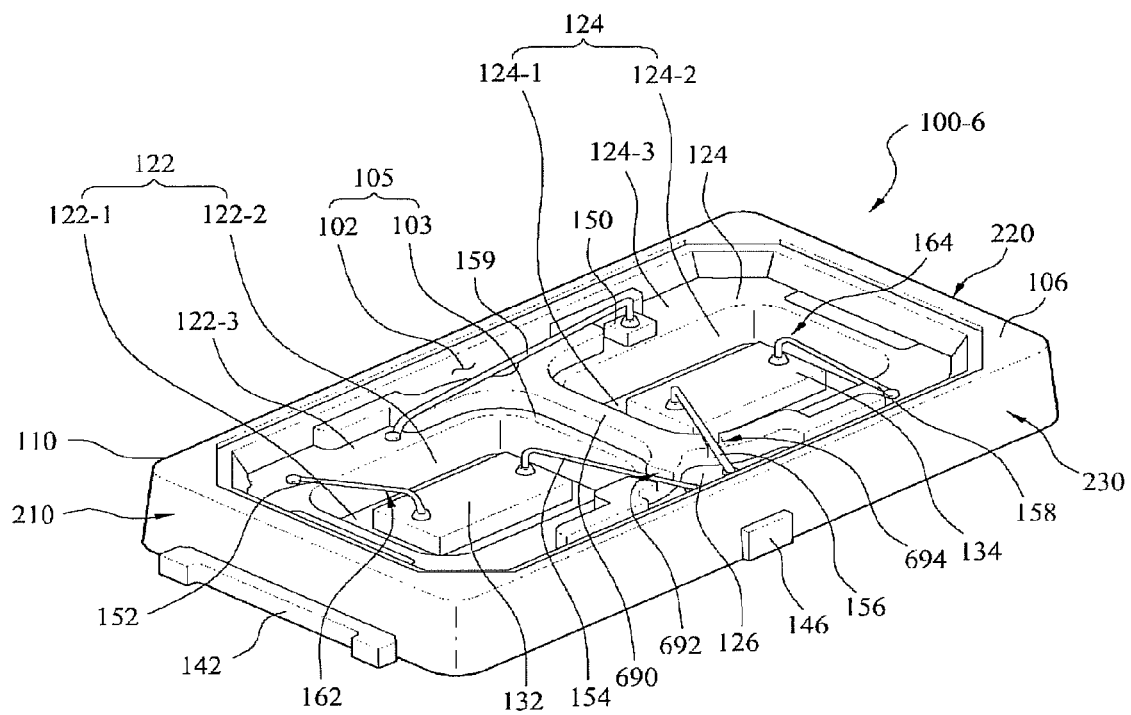
FIG. 18 is a diagram illustrating a light emitting device package according to a still further embodiment.
Figure 19:
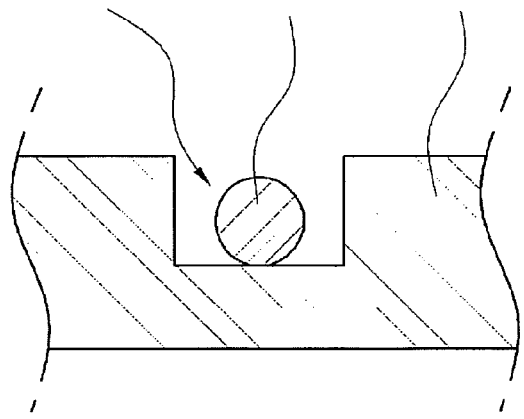
FIG. 19 is a sectional view illustrating recesses shown in FIGS. 14, 15, 18 and 20.

FIG. 18 illustrates a light emitting device 100-6 according to a still further embodiment and FIG. 19 is a sectional view illustrating recesses shown in FIGS. 14, 15, 18 and 20. The same numeral references given to component parts of FIG. 18 as FIG. 1 will refer to the same component parts. Repeated description with respect to the description mentioned above will be omitted or made in brief.

In reference to FIGS. 18 and 19, the light emitting device package 100-6 may include a body 110, a first reflection cup 122, a second reflection cup 124, a first connection pad 126, a second connection pad 128, a first light emitting device 132, a second light emitting device 134, a zenor diode 150, wires 151 to 159 and a blocking partition wall 690.

The blocking partition wall 690 may be disposed on a region of a top surface 103 of the body 110, positioned between the first reflection cup 122 and the second reflection cup 124, between the first reflection cup 122 and the first connection cup 126, between the first reflection cup 122 and the second connection pad 128, between the second reflection cup 124 and the first connection pad 126 and between the second reflection cup 124 and the second connection pad 128. The height and the width of the blocking partition wall 690 may be identical to those of the blocking partition wall 680 shown in FIG. 1.

The blocking partition wall 690 may include a third region 692 positioned between the first reflection cup 122 and the first connection pad 126, with a different height, and a fourth region 694 position between the second reflection cup 124 and the first connection pad 126, with a different height. The heights of the third and fourth regions 692 and 694 may be smaller than the height of the other region of the blocking partition wall 690. A second wire 154 may pass the third region 692 and a third wire 156 may pass the fourth region 694.

For example, the blocking partition wall 690 may include a third recess 692 having the second wire 154 to pass there through and a fourth recess 694 having the third wire 156 to pass there through. The third recess 692 may be provided in a predetermined area of the blocking partition wall 690 that is positioned between the first reflection cup 122 and the first connection pad 126. The fourth recess 694 may be provided in another area of the blocking partition wall 690 that is positioned between the second reflection cup 124 and the first connection pad 126. A fifth wire 159 may electrically connect the first reflection cup 122 with the zenor diode 150, with positioned on the blocking partition wall 690.

Figure 20:
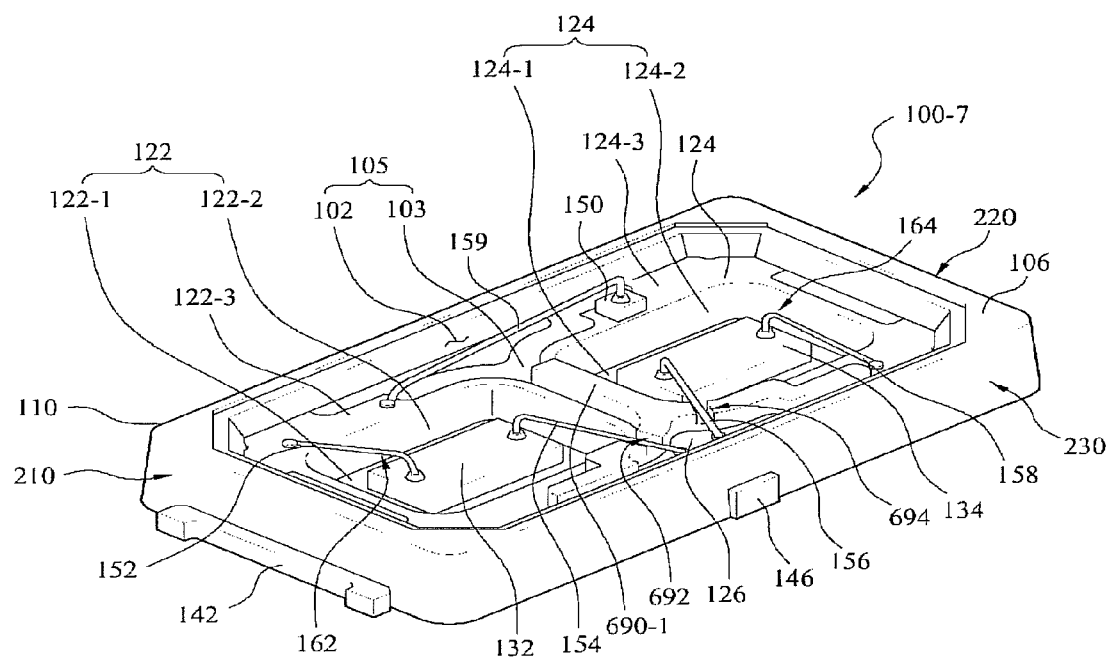
FIG. 20 is a diagram illustrating a light emitting device package according to a still further embodiment.

FIG. 20 illustrates a light emitting device package 100-7 according to a still further embodiment. The same numeral references given to component parts of FIG. 20 as FIG. 18 will refer to the same component parts. Repeated description with respect to the description mentioned above will be omitted or made in brief.

A blocking partition wall 690-1 shown in FIG. 20 may be disposed on a bottom 103 of a cavity 105 that is positioned between a first reflection cup 122 and a second reflection cup 124, between the first reflection cup 122 and a first connection pad 126, between the first reflection cup 122 and a second reflection pad 128 and between the second reflection cup 124 and the first connection pad 126.

The blocking partition wall 690-1 may include a third recess 692 having a second wire 154 to pass there through and a fourth recess 694 having a third wire 156 to pass there through. The third recess 692 may be provided in a predetermined area of the blocking partition wall 690-1 that is located between the first reflection cup 122 and the first connection pad 126. The fourth recess 694 may be provided in another area of the blocking partition wall 690-1 that is positioned between the second reflection cup 124 and the first connection pad 126. A fifth wire 159 may electrically connect the first reflection cup with a zenor diode 150.

In the light emitting device package shown in FIG. 18, the fifth wire 159 may be disposed on the blocking partition wall and it might break easily. However, in the light emitting device package shown in FIG. 20, the blocking partition wall 690-1 may be not disposed between the first reflection cup 122 and the second connection pad 128 and the second reflection cup 124 and the second connection pad 128. Because of that, the height of the fifth wire 159 electrically connecting the first reflection cup 122 with the zenor diode 150 may be smaller than the height of the blocking partition wall 690-1. As a result, the embodiment shown in FIG. 20 may lower the installation height of the fifth wire 159 and it may prevent the fifth wire 159 from breaking easily.

A light emitting device package (not shown) according to a still further embodiment may not include the second connection pad 128 provided in the light emitting device packages shown in FIGS. 1, 14, 15, 16, 17 and 20.

Figure 22:
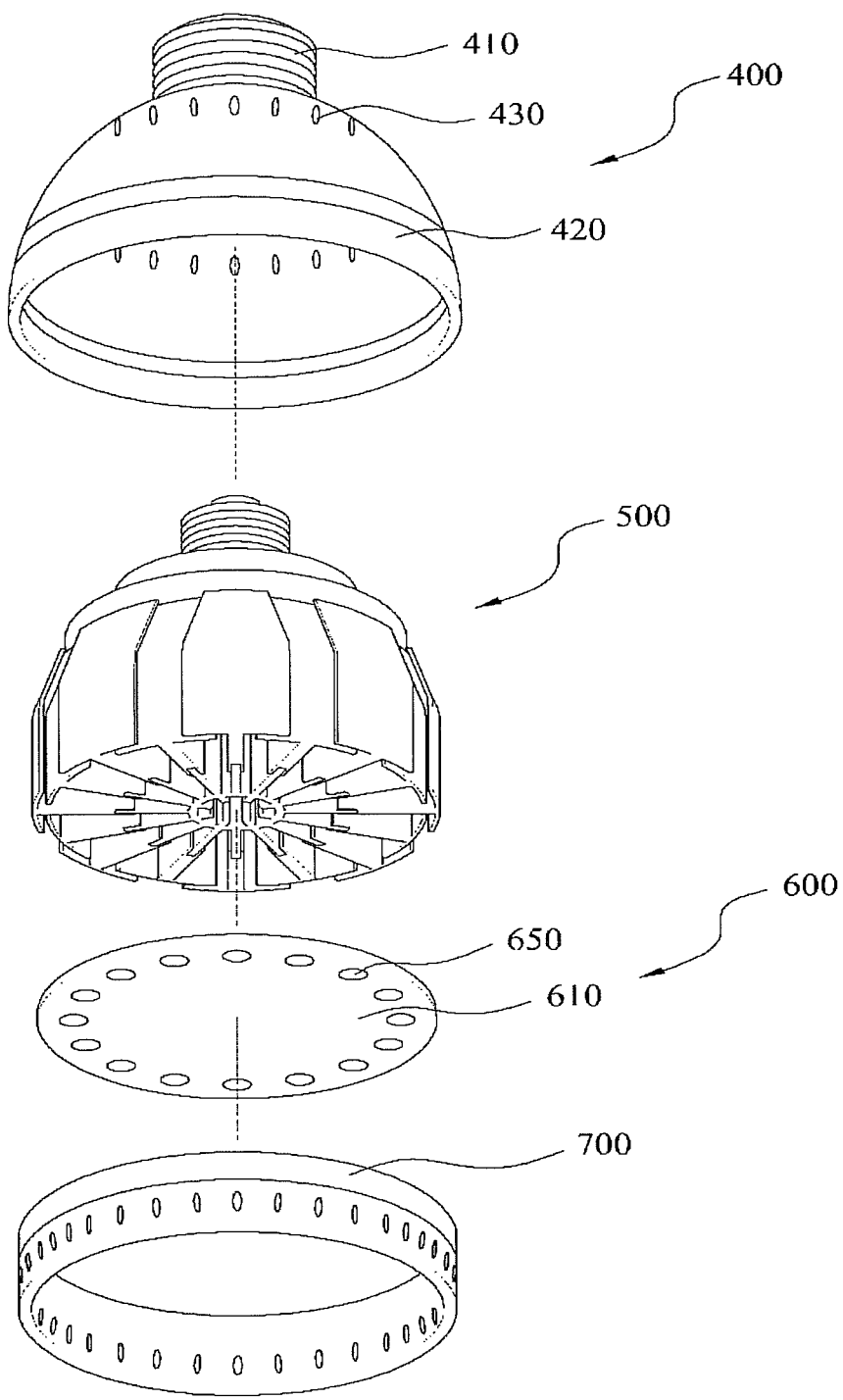
FIG. 22 is an exploded perspective view illustrating a lighting device according to an embodiment, including the light emitting device package according to the embodiments.

FIG. 22 is an exploded perspective view illustrating a lighting device including the light emitting device package according to the embodiments. In reference to FIG. 22.

The lighting device according to this embodiment may include a light source 750 configured to project a light, a housing 700 configured to mount the light source 750 therein, a heat radiation unit 740 configured to radiate the heat of the light source 750, and a holder 760 connecting the light source 750 and the heat radiation unit 740 with the housing 700.

The housing 700 may include a socket-secured part 710 secured to an electric socket (not shown) and a body part 730 connected with the socket-secured part 710, with the light source 750 mounted therein. A single air hole 720 may be formed through the body part 730.

The plurality of the air holes 720 may be formed in the body part 730 of the housing 400. The air hole 720 may be a single hole or the plurality of the air holes may be disposed in a radial direction. Here, various arrangements of the plurality of the air holes may be possible, rather than the radial arrangement.

The light source 750 may include a substrate 754 and a plurality of light emitting device packages 752 disposed on the substrate 754. The substrate 754 may have a predetermined shape to be inserted in an opening of the housing 700 and it may be formed of a material having a high thermal conductivity to transmit heat to the heat radiation unit 740.

The holder 760 may be provided under the light source and it may include a frame and another air hole. Although not shown in the drawing, optical elements may be provided under the light source 750 and lights emitted from the light emitting device package 752 may be diffused, scattered or collected.

The lighting device according to this embodiment may extend a life span of the light emitting device packages mounted therein and can prevent light interference, because it uses the light emitting device package according to the embodiments described above.

Figure 23:
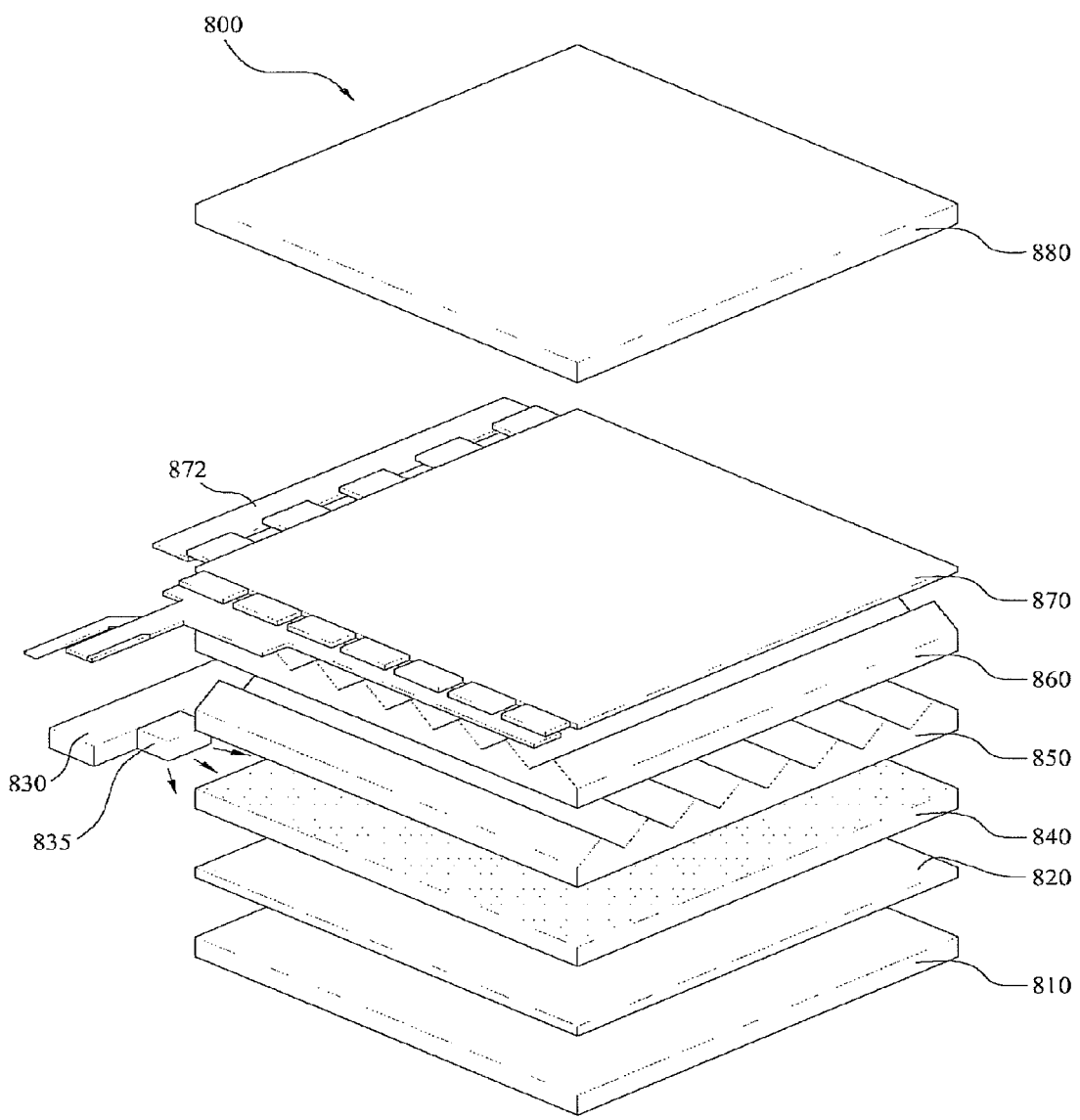
FIG. 23 is a diagram illustrating a display device according to an embodiment, including the light emitting device package according to the embodiments.

FIG. 23 is a diagram illustrating a display device including the light emitting device package according to the embodiments.

In reference to FIG. 23, a display device 800 according to an embodiment may include light source modules 830 and 835, a reflective plate 820 provided on a bottom cover 810, a light guide plate 840 disposed in front of the reflective plate 820 to guide a light emitted from the light source modules 830 and 835 forwardly, an optical sheet including first and second prism sheets 850 and 860 disposed in front of the light guide plate 840, a panel 870 disposed in front of the prism sheets 850 and 860, a image signal output circuit 872 connected with the panel 870 to transmit a image signal on the panel 870 and a color filter 880 disposed in front of the panel 870. Here, the bottom cover 810, the reflective plate 820, the light source modules 830 and 835, the light guide plate 840 and the optical sheet may form a backlight unit.

The light source module includes a light emitting device package 835 provided on a substrate 830. The substrate 830 may be a PCB and the light emitting device package 835 may be one of the light emitting device packages 100-1 to 100-7 according to the embodiments described above.

The bottom cover 810 may hold the inner components of the display device 800. The reflective plate 820 may be an auxiliary component as shown in the drawing or the reflective sheep 820 formed of a material having high reflectivity may be coated on a back surface of the light guide plate 840 or a front surface of the bottom cover 810.

The material which can be used for an ultra-thin film type with a high reflectivity may be used to form the reflective plate 820 and polyethylene terephtalate (PET) may be used for reflective plate 820.

The light guide plate 830 may scatter the lights emitted from the light source modules to distribute the lights to an overall screen area of a liquid crystal display device uniformly. Because of that, the light guide plate 830 may be formed of a material having a good refractive index and transmissivity, for example, polymethylmethacrylate (PMMA), polycarbonate (PC) and polyethylene (PE).

The first prism sheet 850 is formed in a surface of a supporting film and it is formed of polymer having transparency and elasticity. The polymer may have prism layers having a plurality of space structures formed repeatedly. The plurality of the patterns may be ribbed and grooved repeatedly in a stripe type, as shown in the drawing.

A direction of the ribbed and grooved shape formed in the surface of the supporting film provided in the second prism sheet 860 may be perpendicular to a direction of the ribbed and grooved shape formed in the surface of the supporting film provided in the first prism sheet 850. This is because the lights transmitted from the light source module and the reflective sheet have to be distributed in a forward direction of the panel 870 uniformly.

Although not shown in the drawing, a protection sheet may be provided on each of the prism sheets and the protection sheet may include a light diffusive element and binder provided on both surfaces of the supporting film. The prism layer may be formed of a polymer material selected from a group including polyurethane, butadiene-styrene copolymers, polyacrilate, Polymethacrylate, Polymethyl Methacrylate, polyethylene terephtalate elastomer, polyisoprene and polysilicon.

Although not shown in the drawing, a diffuser sheet may be disposed between the light guide plate 840 and the first prism sheet 850. The diffuser sheet may be formed of a polyester-polycarbonate-based material and a light incident from a backlight unit is refracted and scattered, such that a light projection angle may be broadened as much as possible. The diffuser sheet includes a supporting layer having a light-diffusing agent and first and second layers formed in a light emitting surface (toward the first prism sheet) and a light incident surface (toward the reflective sheet), respectively, with no light-diffusing agent.

According to this embodiment, the diffuser sheet, the first prism sheet 850 and the second prism sheet 860 composes an optical sheet. The optical sheet may be configured of other compositions of a micro-lens array, a diffuser sheet and a micro-lens array or a single prism sheet and a micro-lens array, for example.

The panel 870 may be disposed on a liquid crystal display panel and other types of display devices requiring a light source may be provided, rather than the liquid crystal display panel. The color filter 880 is provided on a front surface of the panel 870 and it may transmit only red, green blue lights of the light projected from the panel 870 via pixels. Because of that, the image may be presented.

The display device according to the embodiment uses the light source modules including the light emitting device package according to the embodiments described above. Because of that, the lights emitted from the light emitting devices 132 and 134 may be prevented from interfering with each other.

It will be apparent to those skilled in the art that various modifications and variations can be made in the embodiment without departing from the spirit or scope of the embodiments. Thus, it is intended that the embodiment covers the modifications and variations of this embodiment provided they come within the scope of the appended claims and their equivalents.

What is claimed is:

1. A light emitting device comprising:
   a body including a first cavity configured of a bottom and a reflection wall, and the first cavity including side surfaces, wherein the bottom of the first cavity has a second cavity and a third cavity;
   a first reflection cup in the second cavity;
   a second reflection cup in the third cavity;
   a first connection pad disposed in the body, the first connection pad spaced apart from the first and second reflection cups, and the first connection pad is disposed adjacent to a first side surface of the side surfaces of the first cavity;
   a second connection pad disposed in the body, the second connection pad spaced apart from the first and second reflection cups, and the second connection pad is disposed adjacent to a second side surface of the side surfaces of the first cavity;
   a first light emitting diode disposed in the second cavity of the first reflection cup;
   a second light emitting diode disposed in the third cavity of the second reflection cup; and
   a partition wall that extends in a direction between the first connection pad and the second connection pad, the partition wall disposed on a first area of the bottom of the first cavity positioned between the first reflection cup and the second reflection cup, the partition wall disposed on a second area of the bottom of the first cavity positioned between the first reflection cup and the first connection pad, and the partition wall disposed on a third area of the bottom of the first cavity positioned between the second reflection cup and the first connection pad,
   wherein the first and second reflection cups are made of a conductive material, and
   wherein the first reflection cup is electrically separated from the second reflection cup by the first area of the bottom of the first cavity, and the first reflection cup is electrically separated from the first connection pad by the second area of the bottom of the first cavity, and the second reflection cup is electrically separated from the first connection pad by the third area of the bottom of the first cavity, and
   wherein a top surface of the partition wall is higher than a top of the second cavity and a top of the third cavity, and
   wherein a first portion of the partition wall on the second area of the bottom of the first cavity is adjacent a first region of the first side surface of the first cavity, and a second portion of the partition wall on the third area of the bottom of the first cavity is adjacent a second region of the first side surface of the first cavity.

2. The light emitting device of claim 1, wherein the first reflection cup and the second reflection cup are recessed from the body.

3. The light emitting device of claim 1, wherein the reflection wall is disposed around the first reflection cup, the second reflection cup and the first connection pad.

4. The light emitting device of claim 1, wherein the first connection pad is made of a conductive material.

5. The light emitting device of claim 4, wherein a height of the partition wall is identical to or smaller than a height of the reflection wall of the first cavity.

6. The light emitting device of claim 4, wherein the first light emitting diode comprises first and second electrodes having different polarities from each other, respectively, and the second light emitting diode comprises third and fourth electrodes having different polarities from each other, respectively.

7. The light emitting device of claim 6, further comprising:
   a first wire connecting the first electrode with the first reflection cup;
   a second wire connecting the second electrode with the first connection pad;
   a third wire connecting the first connection pad with the third electrode; and
   a fourth wire connecting the fourth electrode with the second reflection cup.

8. The light emitting device of claim 7, wherein the partition wall is disposed between the first reflection cup and the first connection pad and between the second reflection cup and the first connection pad.

9. The light emitting device of claim 8, wherein the partition wall comprises:
   a second region disposed between the first reflection cup and the first connection pad, with a different height; and
   a third region disposed between the second reflection cup and the first connection pad, with a different height,
   wherein the second wire passes the second region and the third wire passes the third region.

10. The light emitting device of claim 6, further comprising:
    a first wire connecting the first electrode with the first reflection cup;
    a second wire connecting the second electrode with the second reflection cup;

a third wire connecting the first reflection cup with the third electrode; and a fourth wire connecting the fourth electrode with the second reflection cup.

11. The light emitting device of claim 10, wherein the partition wall has partially different heights and the partition wall comprises first and second regions spaced apart from each other, and the second wire passes the first region and the third wire passes the second region.

12. The light emitting device of claim 6, further comprising:

a first wire connecting the first electrode with the first reflection cup;

a second wire connecting the second electrode with the third electrode; and a third wire connecting the fourth electrode with the second reflection cup.

13. The light emitting device of claim 12, wherein the partition wall comprises a first region having a different height, and the second wire passes through the first region.

14. The light emitting device of claim 1, wherein the first reflection cup and the second reflection cup are formed of a material that is different from a material of the body, and the partition wall is formed of a material that is the same as the material of the body.

15. The light emitting device of claim 1, further comprising:

a reflective layer disposed on a side surface of the partition wall.

16. The light emitting device of claim 15, wherein the reflective layer is a distributed Bragg reflective layer or a metal layer of at least one selected from the group consisting of Ag, Ni, Al, Rh, Pd, Ir, Ru, mg, Zn, Pt, Au and Hf or an alloy of them.

17. The light emitting device of claim 1, wherein the second connection pad is spaced apart from the first reflection cup, the second reflection cup and the first connection pad, wherein the second side surface is opposite to the first side surface.

18. A display device comprising:

a panel;

a backlight unit emitting a light toward the panel;

an image signal output circuit connected with the panel, the image signal output circuit to provide an image signal, wherein the backlight unit comprises:

a bottom cover;

a reflective plate disposed on the bottom cover;

a light guide plate disposed on the reflective plate;

a light emitting module comprising a plurality of light emitting device packages disposed on a substrate, to emit a light toward the light guide plate; and an optical sheet disposed on the light guide plate, and each of the light emitting device packages comprises:

a body including a first cavity configured of a bottom and a reflection wall, the first cavity including side surfaces, wherein the bottom of the first cavity has a second cavity and a third cavity;

a first reflection cup in the second cavity;

a second reflection cup in the third cavity;

a first connection pad disposed in the body, the first connection pad spaced apart from the first and second reflection cups, and the first connection pad is disposed adjacent to a first side surface of the side surfaces of the first cavity;

a second connection pad disposed in the body, the second connection pad spaced apart from the first and second reflection cups, and the second connection pad is disposed adjacent to a second side surface of the side surfaces of the first cavity;

a first light emitting diode disposed in the second cavity of the first reflection cup;

a second light emitting diode disposed in the third cavity of the second reflection cup; and a partition wall that extends between the first connection pad and the second connection pad, the partition wall disposed on a first area of the bottom of the first cavity positioned between the first reflection cup and the second reflection cup, the partition wall disposed on a second area of the bottom of the first cavity positioned between the first reflection cup and the first connection pad, and the partition wall disposed on a third area of the bottom of the first cavity positioned between the second reflection cup and the first connection pad, wherein the first and second reflection cups are made of a conductive material, and wherein the first reflection cup is electrically separated from the second reflection cup by the first area of the bottom of the first cavity, and the first reflection cup is electrically separated from the first connection pad by the second area of the bottom of the first cavity, and the second reflection cup is electrically separated from the first connection pad by the third area of the bottom of the first cavity, and wherein a top surface of the partition wall is higher than a top of the second cavity and a top of the third cavity, and wherein a first portion of the partition wall on the second area is adjacent a first region of the first side surface of the first cavity, and a second portion of the partition wall on the third area is adjacent a second region of the first side surface of the first cavity.

19. A light emitting device comprising:

a body having a first cavity including side walls and a bottom surface, wherein the bottom surface of the first cavity has a second cavity and a third cavity;

a first reflection cup in the second cavity;

a second reflection cup in the third cavity;

a first connection pad disposed on the bottom surface of the first cavity and disposed adjacent to a first side wall of the side walls of the first cavity;

a second connection pad disposed on the bottom surface of the first cavity and disposed adjacent to a second side wall of the side walls of the first cavity;

a first light emitting diode disposed in the second cavity of the first reflection cup;

a second light emitting diode disposed in the third cavity of the second reflection cup; and a partition wall that extends between the first connection pad and the second connection pad, the partition wall disposed on a first area of the bottom surface of the first cavity positioned between the first reflection cup and the second reflection cup, the partition wall disposed on a second area of the bottom of the first cavity positioned between the first reflection cup and the first connection pad, and the partition wall disposed on a third area of the bottom of the first cavity positioned between the second reflection cup and the first connection pad, wherein the first and second reflection cups are made of a conductive material, and wherein the first reflection cup is electrically separated from the second reflection cup by the area of the bottom surface of the first cavity, and the first reflection cup is electrically separated from the first connection pad by the second area of the bottom of the first cavity, and the second reflection cup is electrically separated from the first connection pad by the third area of the bottom of the first cavity, and wherein a bottom surface of the first reflection cup is exposed from the bottom surface of the body, and wherein a top surface of the partition wall is higher than a top of the second cavity and a top of the third cavity, and wherein a first portion of the partition wall on the second area is adjacent a first region of the first side wall of the first cavity, and a second portion of the partition wall on the third area is adjacent a second region of the first side wall of the first cavity.

20. The light emitting device of claim 17, wherein the partition wall is further disposed on a fourth area of the bottom of the first cavity positioned between the first reflection cup and the second connection pad, and the partition wall is disposed on a fifth area of the bottom of the first cavity positioned between the second reflection cup and the second connection pad, and wherein a third portion of the partition wall on the fourth area is adjacent a third region of the second side surface of the first cavity, and a fourth portion of the partition wall on the fifth area is adjacent a fourth region of the second side surface of the first cavity.

* * * * *